(12) United States Patent
Bach

(10) Patent No.: US 8,178,927 B2
(45) Date of Patent: May 15, 2012

(54) INTEGRATED CIRCUITS HAVING A CONTACT STRUCTURE HAVING AN ELONGATE STRUCTURE AND METHODS FOR MANUFACTURING THE SAME

(75) Inventor: Lars Bach, Ullersdorf (DE)

(73) Assignee: Qimonda AG, Munich (DE)

( * ) Notice: Subject to any disclaimer, the term of this patent is extended or adjusted under 35 U.S.C. 154(b) by 406 days.

(21) Appl. No.: 12/152,471

(22) Filed: May 14, 2008

(65) Prior Publication Data

US 2009/0283833 A1 Nov. 19, 2009

(51) Int. Cl.
*H01L 21/70* (2006.01)
(52) U.S. Cl. ........ 257/368; 257/319; 257/573; 257/621; 257/774; 257/700; 438/622; 438/618; 438/666; 438/637; 438/640; 438/672; 438/675
(58) Field of Classification Search ................... 257/773, 257/774, 775, 758, 734, 748, 776, 781, 784, 257/786, 316, 319, 343, 368, 573, 584, 621, 257/700; 438/637, 638, 639, 640, 668, 411, 438/461, 611, 118, 622, 618, 666, 612, 614, 438/629, 667, 672, 675, 700, 701, 713, 978
See application file for complete search history.

(56) References Cited

U.S. PATENT DOCUMENTS

| | | | |
|---|---|---|---|
| 6,813,756 B2 * | 11/2004 | Igarashi et al. | 327/156 |
| 2004/0147114 A1 * | 7/2004 | Park et al. | 438/666 |
| 2006/0284259 A1 * | 12/2006 | Lee et al. | 257/365 |
| 2007/0105285 A1 * | 5/2007 | Kusumoto et al. | 438/151 |
| 2007/0190726 A1 * | 8/2007 | Song et al. | 438/264 |
| 2008/0237875 A1 * | 10/2008 | Yamazaki et al. | 257/773 |
| 2008/0237876 A1 * | 10/2008 | Sasagawa | 257/773 |
| 2008/0239786 A1 * | 10/2008 | Fomara | 365/104 |
| 2008/0308848 A1 * | 12/2008 | Inaba | 257/255 |
| 2009/0050972 A1 * | 2/2009 | Lindsay et al. | 257/368 |

\* cited by examiner

*Primary Examiner* — Ha Tran T Nguyen
*Assistant Examiner* — Thanh Y Tran
(74) *Attorney, Agent, or Firm* — John S. Economou

(57) ABSTRACT

In an embodiment, an integrated circuit is provided. The integrated circuit may include an active area extending along a first direction corresponding to a current flow direction through the active area, a contact structure having an elongate structure. The contact structure may be electrically coupled with the active area. Furthermore, the contact structure may be arranged such that the length direction of the contact structure forms a non-zero angle with the first direction of the active area.

23 Claims, 16 Drawing Sheets

FIG 11A
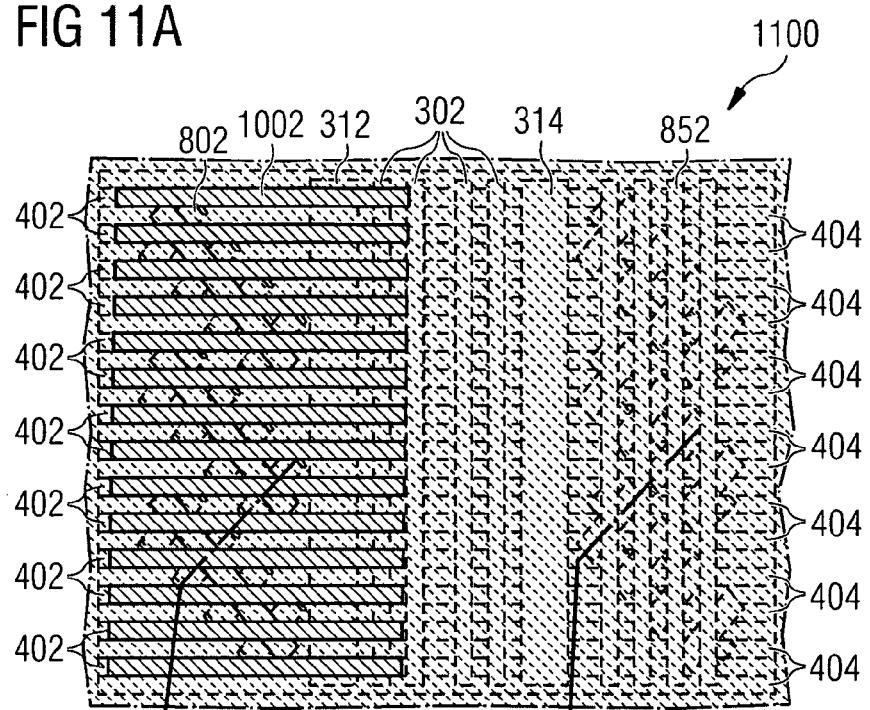
FIG 11B
FIG 11C
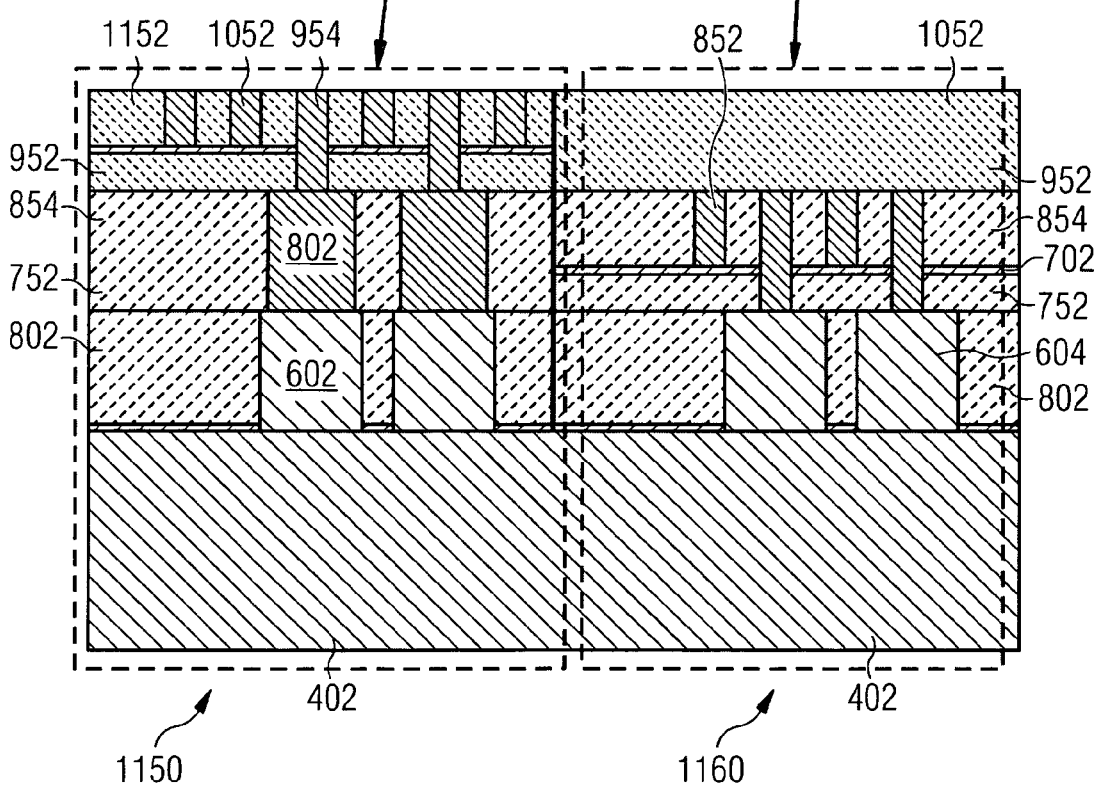

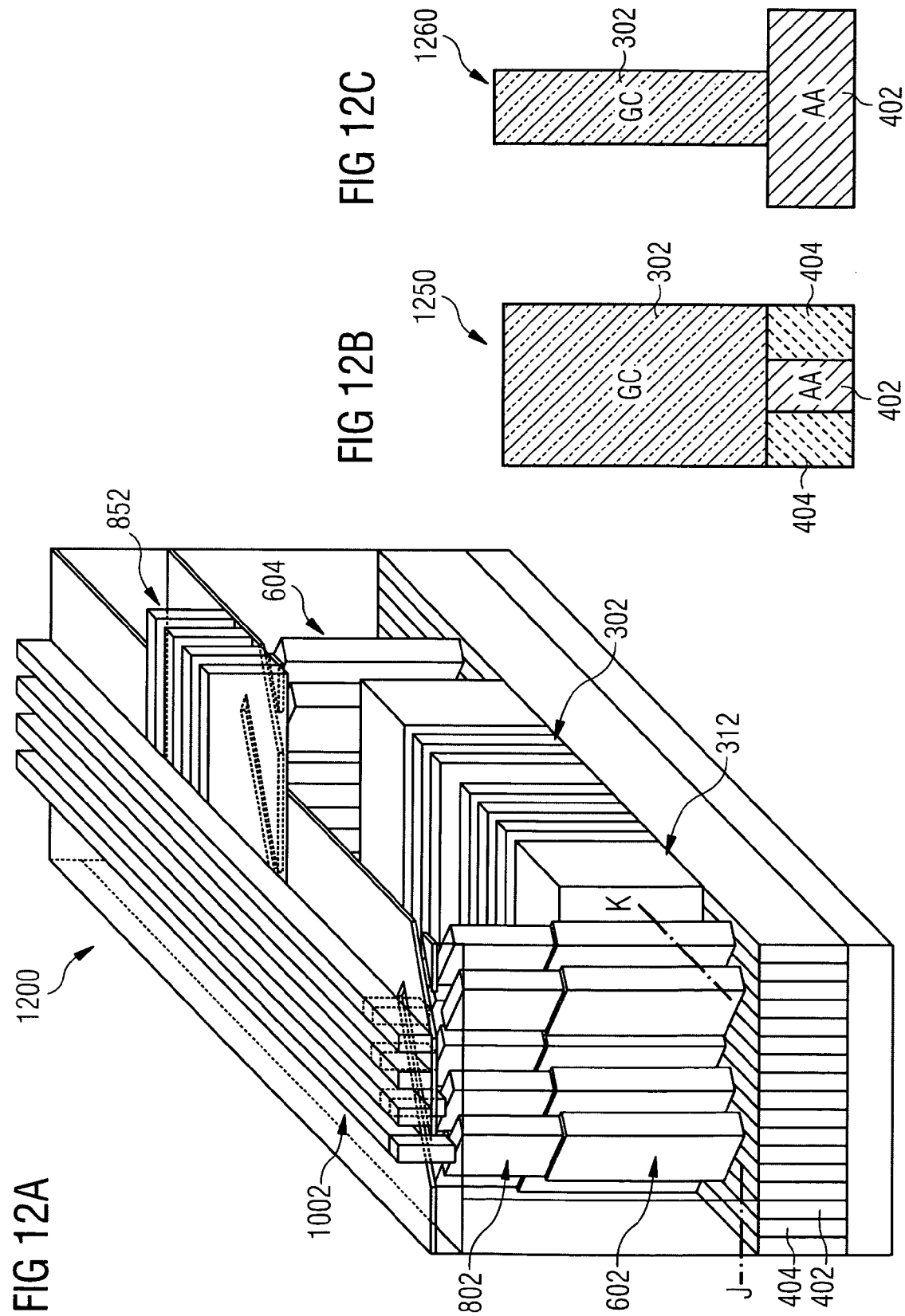

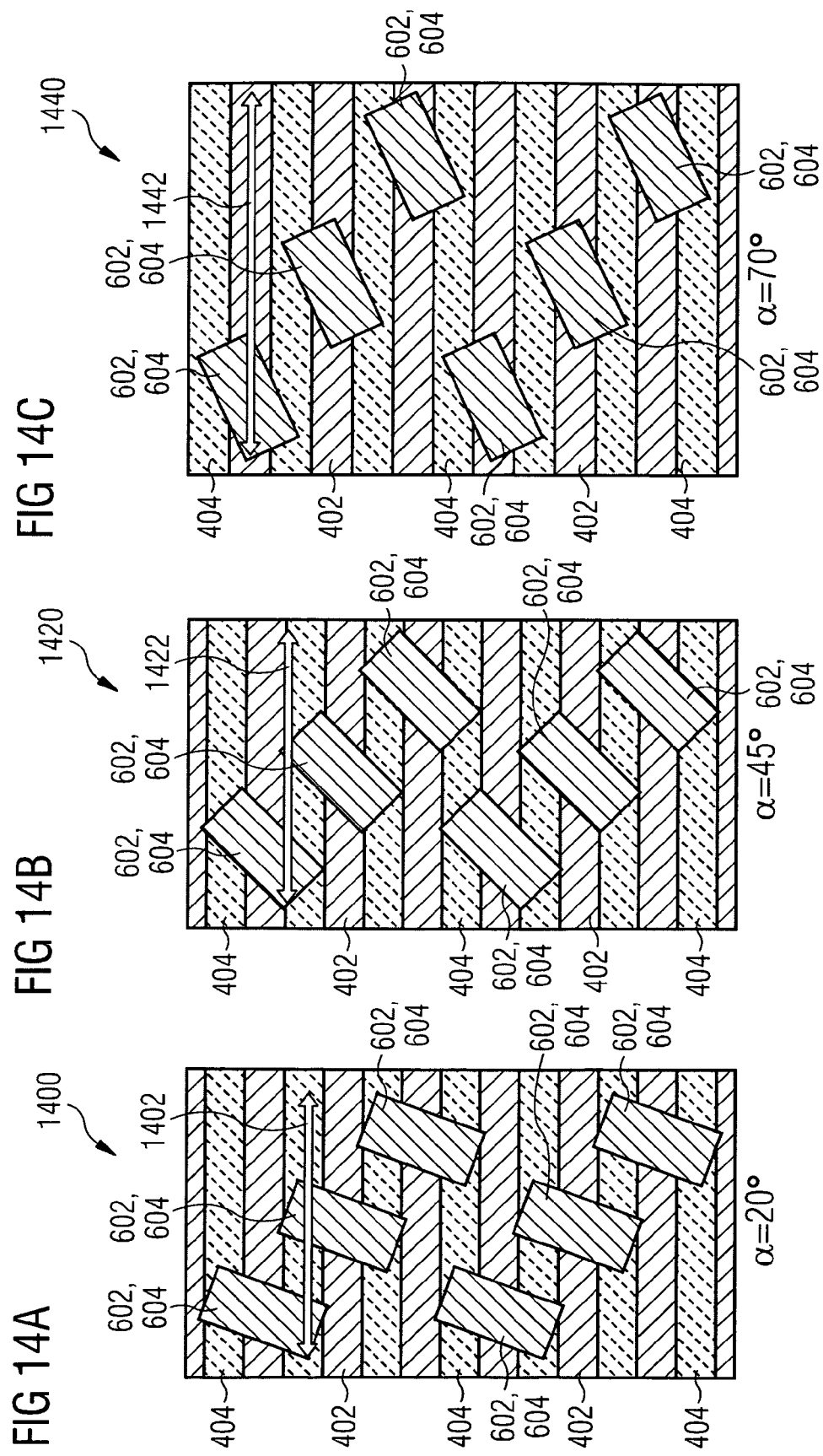

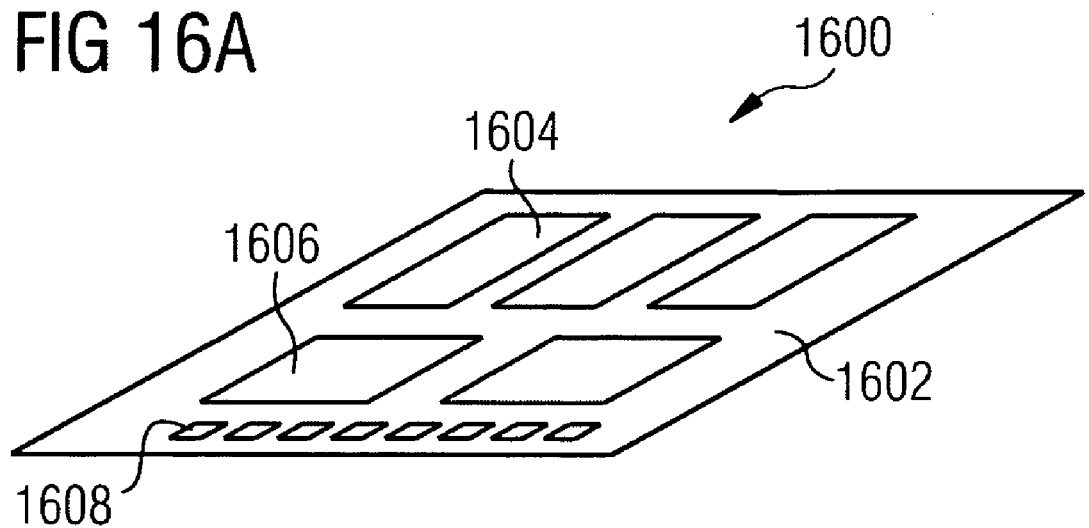
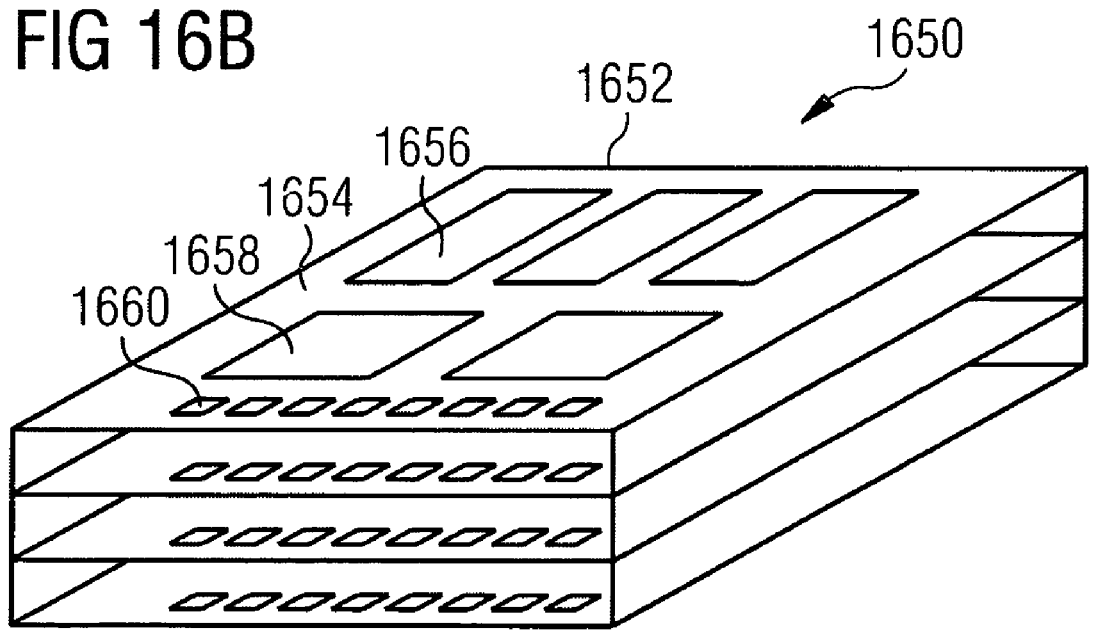

INTEGRATED CIRCUITS HAVING A CONTACT STRUCTURE HAVING AN ELONGATE STRUCTURE AND METHODS FOR MANUFACTURING THE SAME

TECHNICAL FIELD

Embodiments relate generally to integrated circuits having a contact structure having an elongate structure and to methods for manufacturing the same.

BACKGROUND

With the continuing demand with respect to the shrinking of the dimensions of integrated circuits, also the shrinking of contact structures for contacting active areas of the integrated circuits is desirable. The shrinking of the contact structures poses substantial challenges for the manufacturing processes, e.g., with respect to the printing, etching or filling of the contact structures. Thus, "relaxed" contact structures are desired.

Conventional contact structures may be provided as contact chains or so called staggered contacts.

SUMMARY OF THE INVENTION

In an embodiment, an integrated circuit is provided. The integrated circuit may include an active area extending along a first direction corresponding to a current flow direction through the active area, and a contact structure having an elongate structure. The contact structure may be electrically coupled with the active area. Furthermore, the contact structure may be arranged such that the length direction of the contact structure forms a non-zero angle with the first direction of the active area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 11A to 11C show a top view (FIG. 11A), a first cross sectional view (FIG. 11B), and a second cross sectional view (FIG. 11C) of a memory cell field in accordance with an embodiment at the seventh stage of its manufacturing;

FIGS. 12A to 12C show a three dimensional perspective view (FIG. 12A), a third cross sectional view (FIG. 12B), and a fourth cross sectional view (FIG. 12C) of a memory cell field in accordance with an embodiment at the seventh stage of its manufacturing;

FIGS. 14A to 14C show top views of a memory cell field with different tilting angles of contact structures with respect to active areas in accordance with an example;

FIGS. 16A and 16B show an integrated circuit module (FIG. 16A) and a stackable integrated circuit module (FIG. 16B) in accordance with an embodiment.

DETAILED DESCRIPTION OF ILLUSTRATIVE EMBODIMENTS

As will be described in more detail below, various embodiments provide relaxed contacts or contact structures, which are, e.g., relaxed with respect to their manufacturing, e.g., with respect to printing processes, etching processes or filling processes. By way of example, the contacts or contact structures may connect the corresponding contacts or contact structures on lines (e.g., on bit lines, e.g., arranged on upper metal levels (Mx)) at a half pitch (F) resolution. Furthermore, in various embodiments, the contacts or contact structures are scalable and may be used, in other words are operable, for a plurality of integrated circuit generations.

Figure 1:
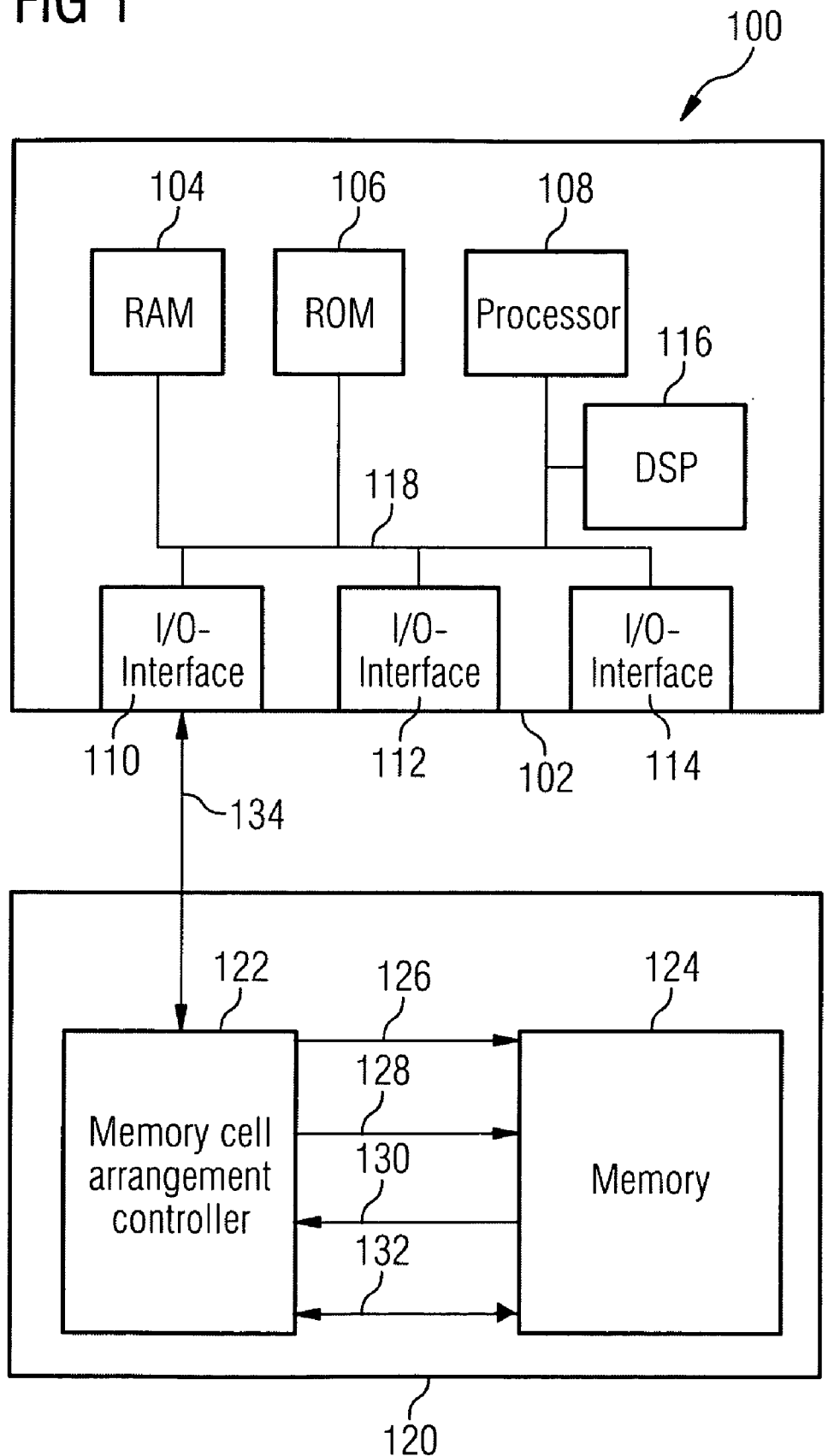
FIG. 1 shows a computer system having a memory cell arrangement in accordance with an embodiment.

FIG. 1 shows a computer system 100 having a computer arrangement 102 and a memory cell arrangement 120 in accordance with an embodiment.

In various embodiments, the computer arrangement 102 may be configured as or may include any device having a processor, e.g., having a programmable processor such as, e.g., a microprocessor (e.g., a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), or another device having a processor (such as, e.g., a household appliance (such as, e.g., a washing machine, a dishwashing machine, etc.))

In an embodiment, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/output interfaces 110, 112, 114 may be implemented in accordance with one of the following communication protocols:

an ad hoc communication protocol such as, e.g., Firewire or Bluetooth;
a communication protocol for a serial data transmission such as, e.g., RS-232, Universal Serial Bus (USB) (e.g., USB 1.0, USB 1.1, USB 2.0, USB 3.0);
any other communication protocol such as e.g. Infrared Data Association (IrDA).

In an embodiment, the first input/output interface 110 is a USB interface (in alternative embodiments, the first input/output interface 110 may be configured in accordance with any other communication protocol such as, e.g., in accordance with a communication protocol which has been described above).

In an embodiment, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment, may include the memory cell arrangement 120.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example, implemented by means of hard wired logic and/or by means of one or a plurality of programmable processors, e.g., by means of one or a plurality of programmable processors such as, e.g., one or a plurality of programmable microprocessors (e.g., CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g., by means of a USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

It should be mentioned that although the following description focuses on a memory cell arrangement, in alternative embodiments, also logic devices, e.g., having logic transistors being contacted using contacts or contact structures in accordance with the described embodiments may be provided. In various examples, the one or more transistors which may include an active area may be one or more field effect transistors or bipolar transistors. Alternatively, any other type of transistor may be used in an alternative embodiment. Furthermore, the one or more transistors may be provided in planar technology (e.g., as planar transistors or as vertical transistors) or, e.g., in fin technology (e.g., as fin FETs, e.g., as Multiple Gate (MUG) FETs) or in any other type of technology.

Figure 2:
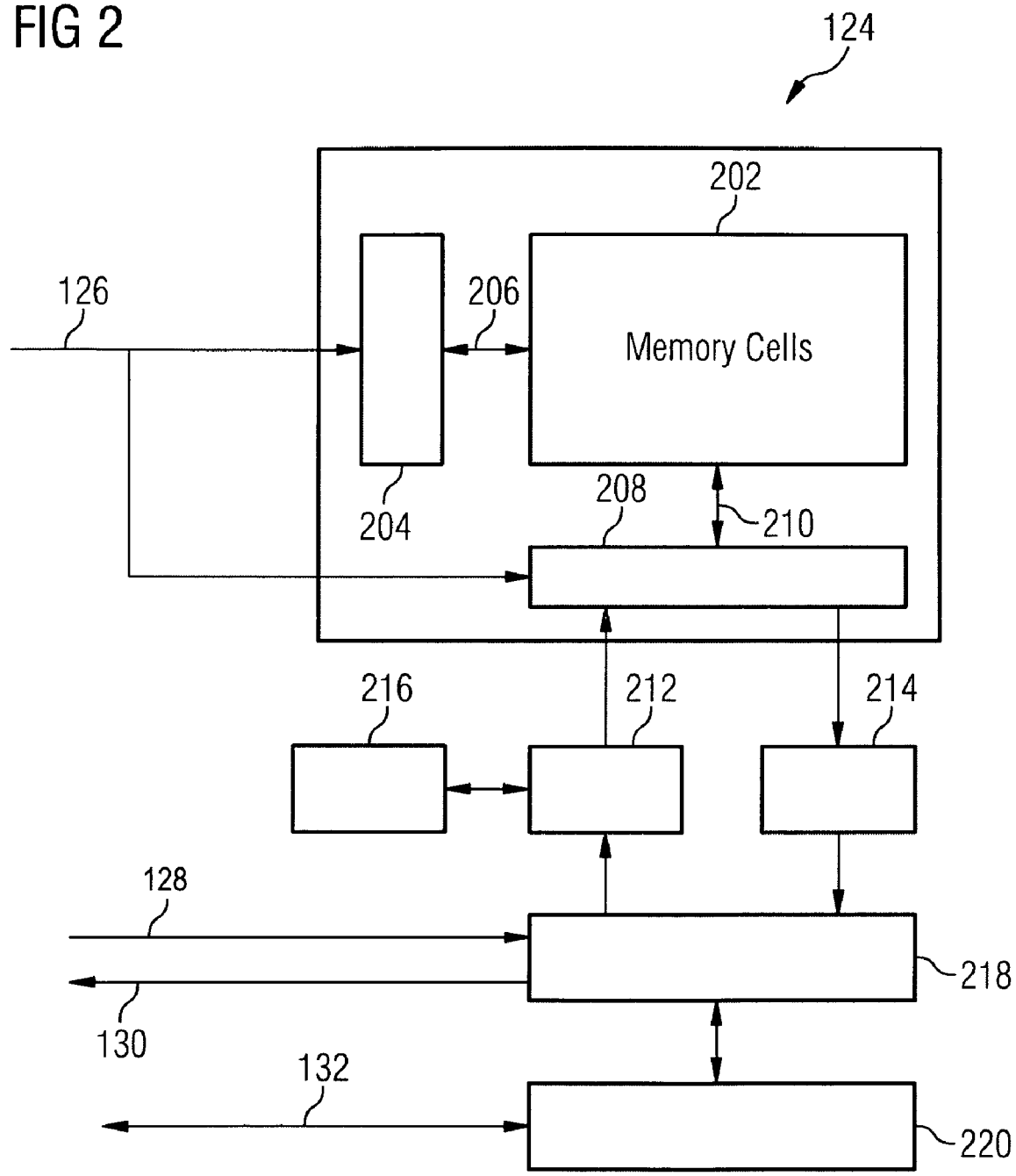
FIG. 2 shows a memory in accordance with an embodiment.

FIG. 2 shows the memory 124 of FIG. 1 in accordance with an embodiment in more detail.

In an embodiment, the memory 124 may include a memory cell field (e.g., a memory cell array) 202 having a plurality of memory cells. The memory cells may be arranged in the memory cell field 202 in the form of a matrix in rows and columns, or, alternatively, for example, in zig zag form. In other embodiments, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment, the memory cells are non-volatile memory cells.

A "non-volatile memory cell" may be understood as a memory cell storing data even if it is not active. In an embodiment, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of:
- charge storing random access memory cells (e.g. floating gate memory cells or charge trapping memory cells);
- ferroelectric random access memory cells (FeRAM, FRAM);
- magnetoresistive random access memory cells (MRAM);
- phase change random access memory cells (PCRAM, for example, so called Ovonic Unified Memory(OUM) memory cells);
- conductive filament random access memory cells (e.g., conductive bridging random access memory cells (CBRAM), also referred to as programmable metallization cells (PMC), or carbon-based conductive filament random access memory cells);
- organic random access memory cells (ORAM);
- nanotube random access memory cells (NRAM) (e.g., carbon nanotube random access memory cells);
- nanowire random access memory cells.

In alternative embodiments, also other types of non-volatile memory cells may be used.

In various embodiments, the memory cells may be resistive memory cells.

Furthermore, the memory cells may be electrically erasable read only memory cells (EEPROM).

In an embodiment, the memory cells may be Flash memory cells, e.g., charge storing memory cells such as, e.g., floating gate memory cells or charge trapping memory cells.

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment, the charge trapping layer structure includes two, four or even more dielectric layers being formed above one another.

In an embodiment, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In another embodiment, the memory cells may be volatile memory cells. In the context of this description, a "volatile memory cell" may be understood as a memory cell storing data, the data being refreshed during a power supply voltage of the memory system being active, in other words, in a state of the memory system, in which it is provided with power supply voltage. In an embodiment of the invention, a "volatile memory cell" may be understood as a memory cell storing data, the data being refreshed during a refresh period in which the memory cell is provided with a power supply voltage corresponding to the level of the stored data. In an example, the volatile memory cells may be dynamic random access memory (DRAM) cells (e.g., implementing trench capacitor technology or stack capacitor technology).

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row and thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing of one memory cell or of a plurality of memory cells, are applied to the selected at least one row control line 206 and to the at least one column control line 210.

In the case that each memory cell is configured in the form of a field effect transistor (e.g., in the case of a charge storing memory cell), in an embodiment, the respective gate terminal is coupled to the row control line 206 and a first source/drain terminal is coupled to a first column control line 210. A second source/drain terminal may be coupled to a second column control line 210. Alternatively, with a first source/drain terminal of an adjacent memory cell, which may then, e.g., also be coupled to the same row control line 206 (this is the case, e.g., in a NAND arrangement of the memory cells in the memory cell field 202).

In an embodiment, by way of example, for reading or for programming, a single row control line 206 and a single column control line 210 are selected at the same time and are appropriately driven for reading or programming of the selected memory cell. In an alternative embodiment, it may be provided to respectively select a single row control line 206 and a plurality of column lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented, e.g., by means of an electrical current, which flows through the addressed memory cell and the corresponding column control line 210, which may be compared with a current threshold value in order to determine the content of the memory cell, wherein the current threshold value may, e.g., be dependent from the reference memory cells 216) are, e.g., buffered in the read buffer memory 214 during the read operation. The result of the comparison and therewith the logic state of the memory cell (wherein the logic state of the memory cell represents the memory content of the memory cell) may then be stored in the data register 218 and may be provided via the data read connection 130, with which the data register 218 may be coupled.

The access operations (e.g., write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 124, but they are neither shown in FIG. 1 nor FIG. 2 for reasons of clarity.

Figure 3:
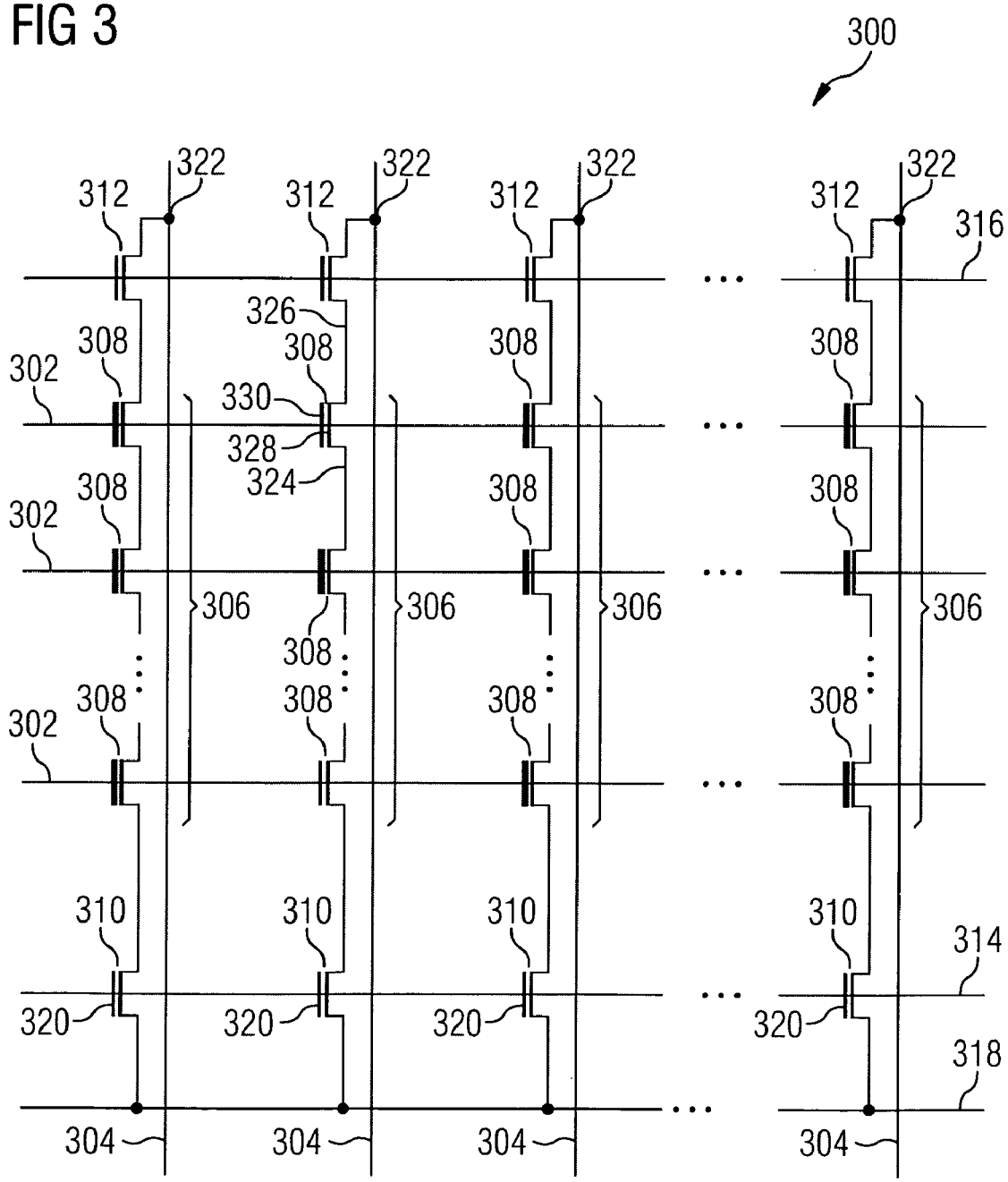
FIG. 3 shows an example of the memory cell field of FIG. 2 in accordance with an embodiment.

FIG. 3 shows a memory cell portion 300 of the memory cell field 202 in accordance with an embodiment.

In one embodiment, the memory cell portion 300 is arranged as a NAND memory cell field (although another coupling architecture may be provided in an alternative embodiment).

In an embodiment, the NAND memory cell portion 300 (e.g., a NAND memory cell array portion 300) may include word lines 302 (in general, an arbitrary number of word lines 302, in one embodiment, 1024 word lines 302) and intersecting bit lines 304 (in general, an arbitrary number of bit lines 304, in one embodiment, 512 bit lines 304).

The NAND memory cell array portion 300 may include NAND strings 306, each NAND string 306 having memory cells 308 (e.g., charge storing memory cells 308 such as, e.g., charge trapping memory cells 308 or floating gate memory cells 308). Furthermore, an arbitrary number of memory cells 308 can be provided in the NAND string 306, in accordance with one embodiment, 32 memory cells 308. The memory cells 308 are connected in series source-to-drain between a source select gate 310, which may be implemented as a field effect transistor, and a drain select gate 312, which may also be implemented as a field effect transistor. Each source select gate 310 is positioned at an intersection of a bit line 304 and a source select line 314. Each drain select gate 312 is positioned at an intersection of a bit line 304 and a drain select line 316. The drain of each source select gate 310 is connected to the source terminal of the first memory cells 308 of the corresponding NAND string 306. The source of each source select gate 310 is connected to a common source line 318. A control gate 320 of each source select gate 310 is connected to the source select line 314.

In one embodiment, the common source line 318 is connected between source select gates 310 for NAND strings 306 of two different NAND arrays. Thus, the two NAND arrays share the common source line 318. In an alternative embodiment, each NAND array may have an own separate source line 318.

In an embodiment, the drain of each drain select gate 312 may be connected to the bit line 304 of the corresponding NAND string 306 at a drain contact 322. The source of each drain select gate 312 is connected to the drain of the last memory cell 308 of the corresponding NAND string 306. In one embodiment, at least two NAND strings 306 share the same drain contact 322.

In accordance with the described embodiments, each memory cell 308 may include a source 324 (e.g., a first source/drain region), a drain 326 (e.g., a second source/drain region), a charge storage region 328 (e.g., a floating gate stack or a dielectric layer stack) and a control gate 330 (e.g., a gate region). The control gate 330 of each memory cell 308 may be connected to a respective word line 302. A column of the NAND memory cell array portion 300 may include a respective NAND string 306 and a row of the NAND memory cell array portion 300 may include those memory cells 308 that are commonly connected to a respective word line 302.

In an alternative embodiment, the memory cell portion 300 is a NOR memory cell array portion 300. In yet another embodiment, the memory cell portion 300 may be arranged in accordance with any other suitable architecture.

Figure 4A:
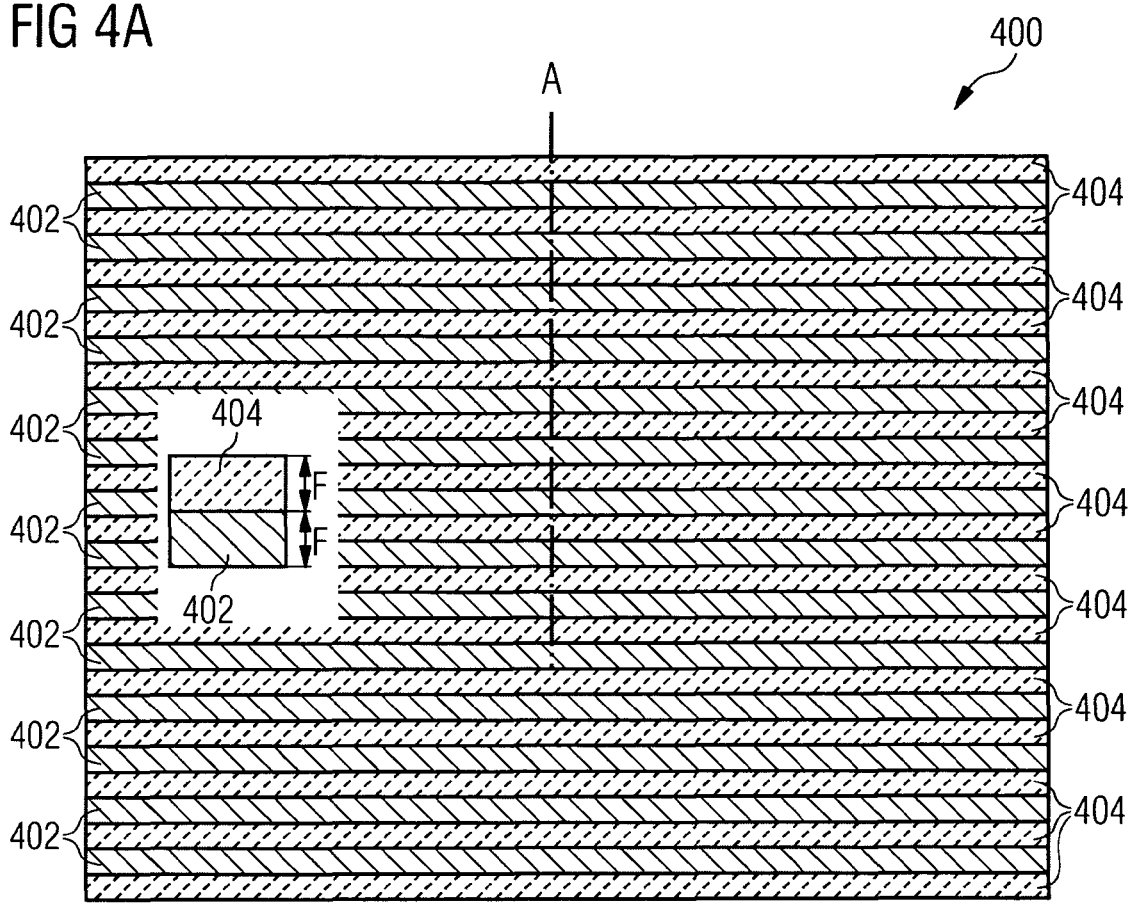
FIGS. 4A and 4B show a top view (FIG. 4A) and a cross sectional view (FIG. 4B) of a memory cell field in accordance with an embodiment at a first stage of its manufacturing.
Figure 4B:
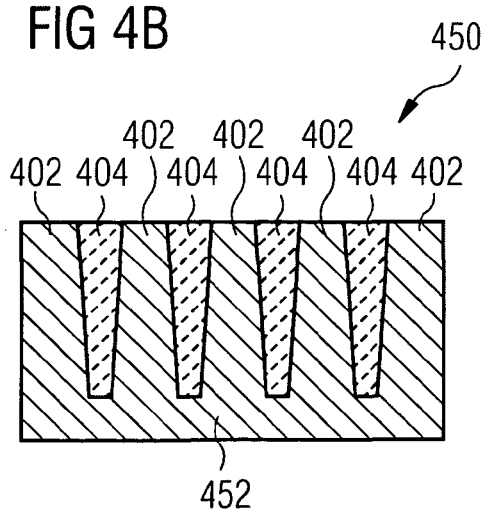

FIGS. 4A and 4B show a top view 400 (FIG. 4A) and a cross sectional view 450 (FIG. 4B) along section line A of FIG. 4A of a memory cell field in accordance with an embodiment at a first stage of its manufacturing.

As shown in FIGS. 4A and 4B, a substrate 452 is provided. In an embodiment, the substrate (e.g., a wafer substrate) 452 may be made of semiconductor materials of various types, including silicon, germanium, Group III to V or other types, including polymers, for example, although in another embodiment, other suitable materials can also be used. In an embodiment, the substrate 452 is made of silicon (doped or undoped), in an alternative embodiment, the substrate 452 is a silicon on insulator (SOI) wafer substrate. As an alternative, any other suitable semiconductor materials can be used for the substrate 452, for example, semiconductor compound material such as gallium arsenide (GaAs), indium phosphide (InP), but also any suitable ternary semiconductor compound material or quaternary semiconductor compound material such as indium gallium arsenide (InGaAs).

In as such a conventional manner, active areas 402 (which may form the active areas of one or more transistors, e.g., one or more field effect transistors) are formed extending along a first direction corresponding to a current flow direction through the active areas 402 (e.g., the current flow direction through the transistor active areas). Furthermore, shallow trench isolations (STI) 404 (in an implementation made of an oxide such as, e.g., silicon oxide, although in an alternative example, any other suitable isolating material may be used), in an alternative example any other suitable isolation structure may be provided in the substrate 452 between the active areas 402, thereby electrically isolating the respective adjacent active areas 402 from one another. In an example, the STIs 404 also run in the first direction parallel to the length extension of the active areas 402.

In an example, the active areas 402 as well as the STIs 404 have a width of a minimum feature size (F) of the respectively used lithographic process. Thus, in an example, the active areas 402 are arranged at a distance of a half pitch (F) from one another. It should be mentioned that other dimensions or distances may be provided in an alternative example.

Figure 5A:
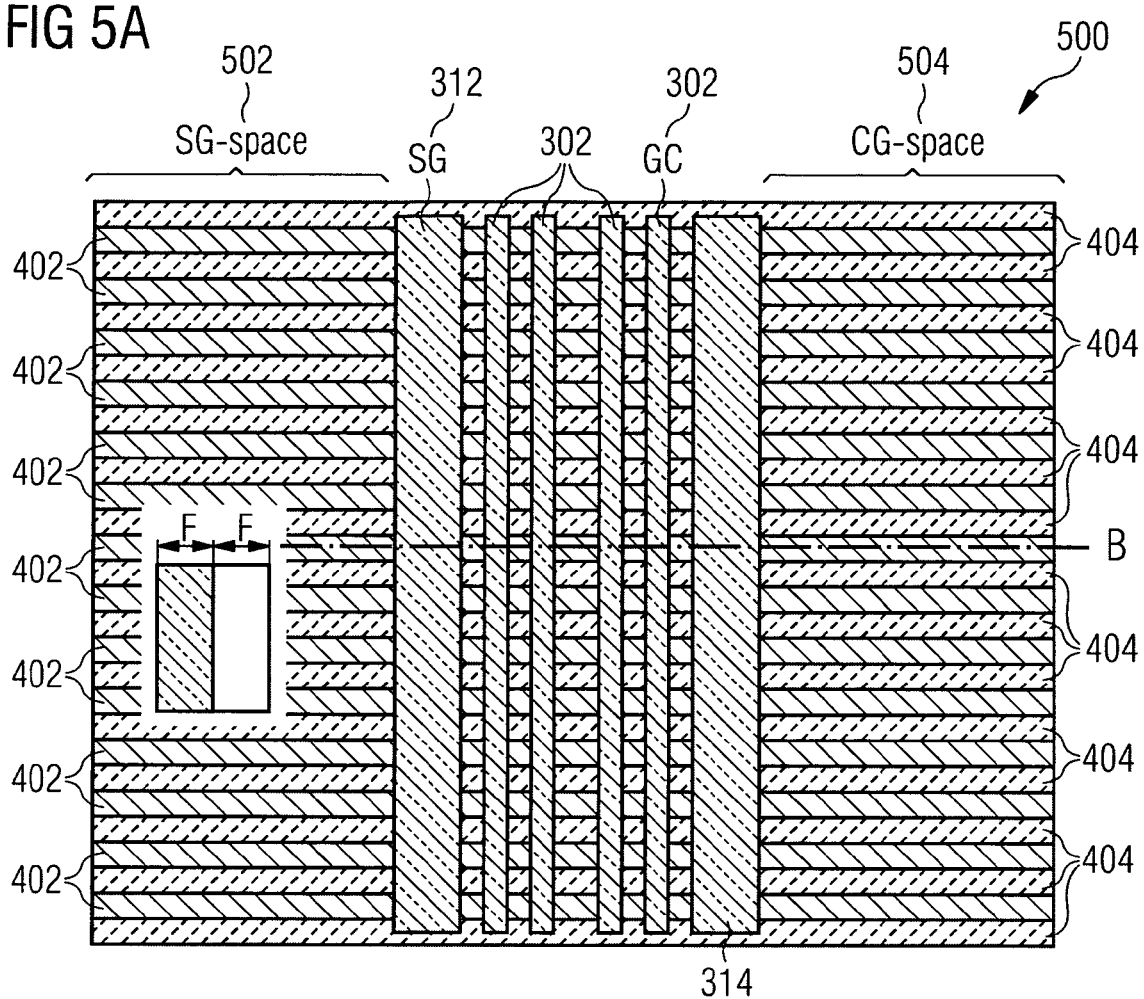
FIGS. 5A and 5B show a top view (FIG. 5A) and a cross sectional view (FIG. 5B) of a memory cell field in accordance with an embodiment at a second stage of its manufacturing.
Figure 5B:
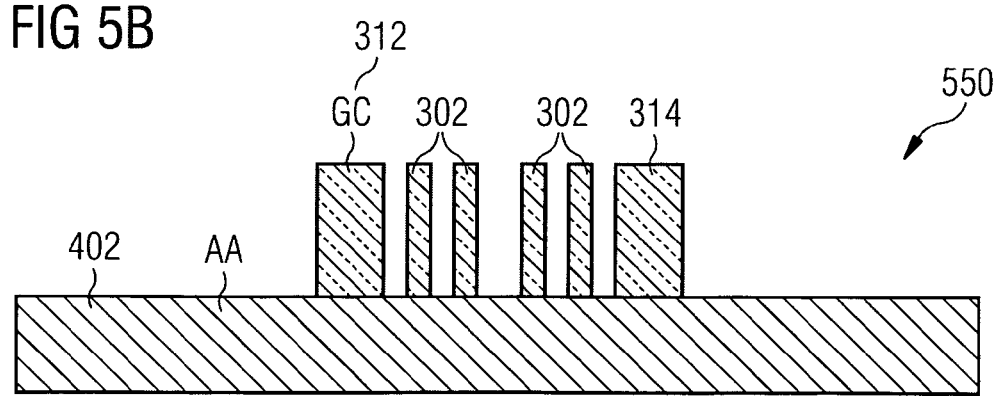

FIGS. 5A and 5B show a top view 500 (FIG. 5A) and a cross sectional view 550 (FIG. 5B) along section line B (along the first direction through an active area) of FIG. 5A of a memory cell field in accordance with an embodiment at a second stage of its manufacturing.

Then, in an embodiment, control regions and control terminals of the respective transistors (e.g., field effect transistors or bipolar transistors) may be formed. In case the respective transistors are field effect transistors, each control region of the control regions may include a gate region (e.g., isolated from the active region by means of a gate isolation layer, e.g. an oxide layer). In case the respective transistor is formed as a memory transistor, e.g., a charge storing memory transistor (e.g., a floating gate memory transistor or a charge trapping memory transistor), a charge storage region and a gate region may be formed. As shown in FIGS. 5A and 5B, in an example, the drain select gates 312, the source select gates 314 (also referred to as source select lines) and the word lines 302 of the memory cells are formed and connected to the gate regions of the memory cells 308 of the NAND strings. The width of the word lines 302 as well as the pitch between the word lines 302 may be F. The width of the drain select gates 312 the source select gates 314 may be larger than F. Furthermore, a drain select gate space 502 (next to the drain select gate 312) and a source select gate space 504 (next to the source select gate 312) may be provided, in which contact structures will be formed in subsequent processes, as will be described in more detail below.

Figure 6A:
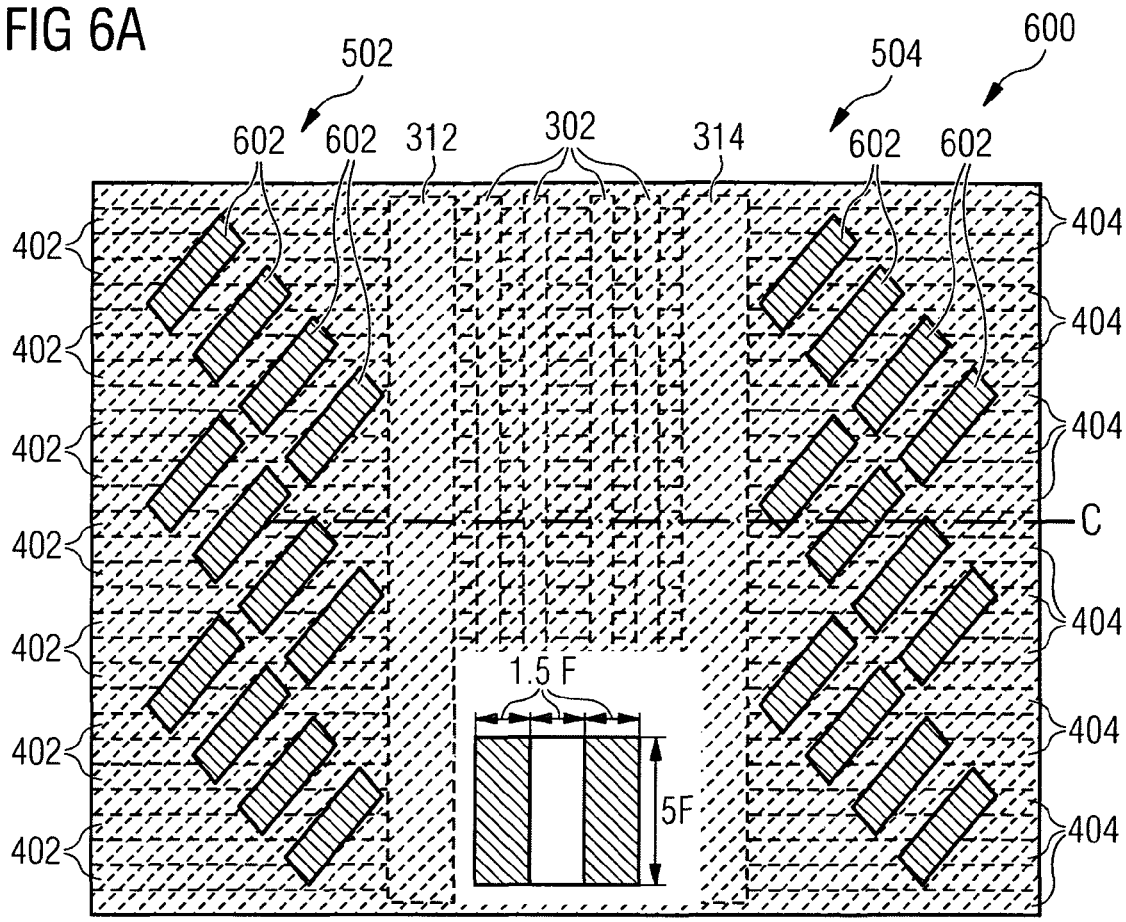
FIGS. 6A and 6B show a top view (FIG. 6A) and a cross sectional view (FIG. 6B) of a memory cell field in accordance with an embodiment at a third stage of its manufacturing.
Figure 6B:
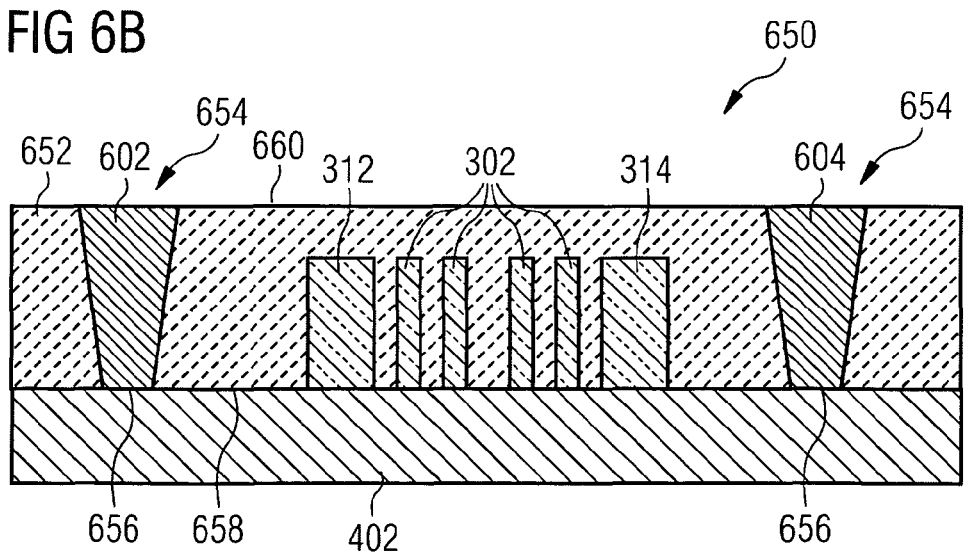

FIGS. 6A and 6B show a top view 600 (FIG. 6A) and a cross sectional view 650 (FIG. 6B) along section line C (along the first direction through an active area 402) of FIG. 6A of a memory cell field in accordance with an embodiment at a third stage of its manufacturing.

As shown in FIGS. 6A and 6B, the space between the gate structures 302, 312, 314, of FIGS. 5A and 5B may be filled in an example with electrically isolating material 652 (it should be noted that the electrically isolating material 652 is not shown in FIG. 6A) such as, e.g., with an oxide (e.g., silicon oxide). In an alternative implementation, any other suitable isolating material may be used instead of the electrically isolating material 652, e.g., any suitable dielectric, e.g., low-k dielectric material such as, e.g., a porous glass. After having deposited (e.g., using a vapor deposition process such as, e.g., a chemical vapor deposition process (CVD) or a physical vapor deposition process (PVD)) the electrically isolating material 652, the deposited layer may be planarized, e.g., using a chemical mechanical polishing (CMP) process. Next, using a corresponding lithographic process, a mask (e.g., including a photo resist layer) is illuminated such that contact structures may be formed in subsequent processes in the drain select gate space 502 (next to the drain select gate 312) and the source select gate space 504 (next to the source select gate 312). In an alternative implementation, the contact structures may be provided by directly printing the contact structures (e.g., directly printing of contact chains) or, e.g., using double patterning technique (also referred to as pitch frag technique). As shown in FIG. 6A, the contact structures to be formed have an elongate or oblong structure, thereby achieving a more relaxed lithography in this case.

Then, e.g., using the illuminated and developed photo resist layer as the mask (e.g., additionally using an auxiliary mask layer such as, e.g., one or more hard mask layers) contact structure holes 654 may be etched (e.g., using an anisotropic etching process, e.g., a reactive ion etching (RIE) process) into the electrically isolating material 652, thereby exposing portions 656 of the upper surface 658 of the active area 402.

Next, the contact structure holes 654 may be filled with electrically conductive material (e.g., with a metal such as, e.g., tungsten (W) or tungsten silicide (WSi), or any other suitable electrically conductive material). After having filled the contact structure holes 654 with electrically conductive material, a planarization process (e.g., a CMP) may be carried out to remove the material overfilling the contact structure holes 654, thereby again exposing the upper surface 660 of the electrically isolating material 652. Thus, contact structures 602, 604, may be formed, which are electrically isolated from each other, e.g., contact bit line structures 602 (on the left hand side in FIG. 6B next to the drain select gate 312) and the source line contact structures 604 (on the right hand side in FIG. 6B next to the source select gate 312).

As shown in FIGS. 6A and 6B, although the contact structures 602, 604, have a round shape at the upper surface thereof, they have a smaller dimension at their bottom surface, in other words, they have a tapered shape. Thus, although the upper surface of the contact structures 602, 604 might cover a plurality of active areas 402, actually, only one active area is respectively exposed by the contact structure holes 654, thereby ensuring that exactly one active area is respectively contacted and driven using one respective contact bit line structure 602 and source line contact structure 604, respectively.

As also shown in FIGS. 6A and 6B, the contact structures 602, 604, may have an elongate or oblong structure, the main axis direction of which form a non-zero angle with the first direction along which the active areas 402 run. In an example, the non-zero angle lies between 0° and 90°, e.g., between 10° and 80°, e.g., between 20° and 70°. In various implementations, the non-zero angle may be about 20°, or about 45°, or about 70°. Adjacent contact structures 602, 604, may be offset in two dimensions along the main processing surface of the electrically isolating material 652. In an example, the contact structures 602, 604, may be formed as contact chains or staggered contacts. Illustratively, the contact structures 602, 604, may be tilted by a non-zero degree angle with respect to the main axis direction (e.g., the first direction or current flow direction) of the active areas 402.

Figure 7A:
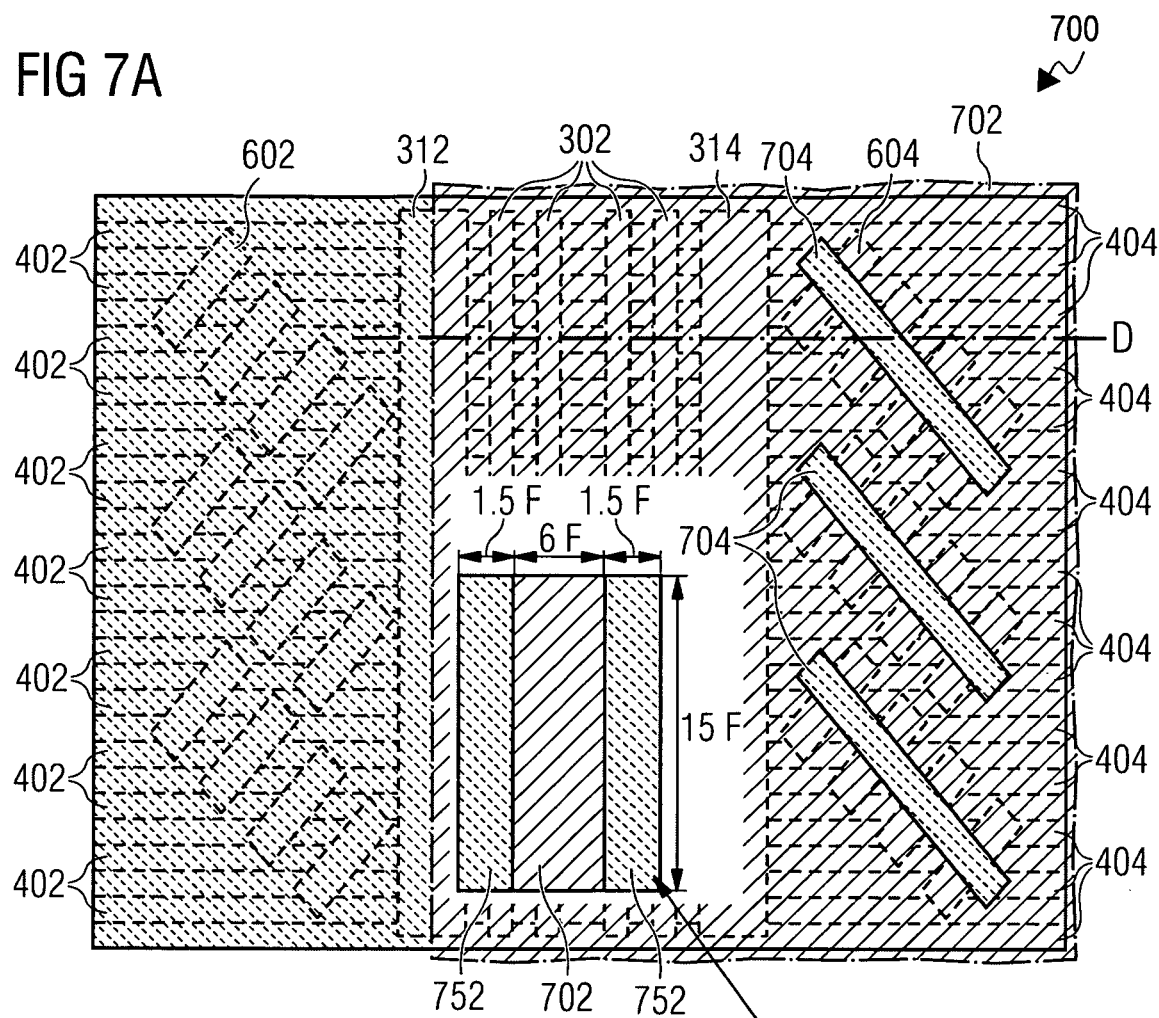
FIGS. 7A and 7B show a top view (FIG. 7A) and a cross sectional view (FIG. 7B) of a memory cell field in accordance with an embodiment at a fourth stage of its manufacturing.
Figure 7B:
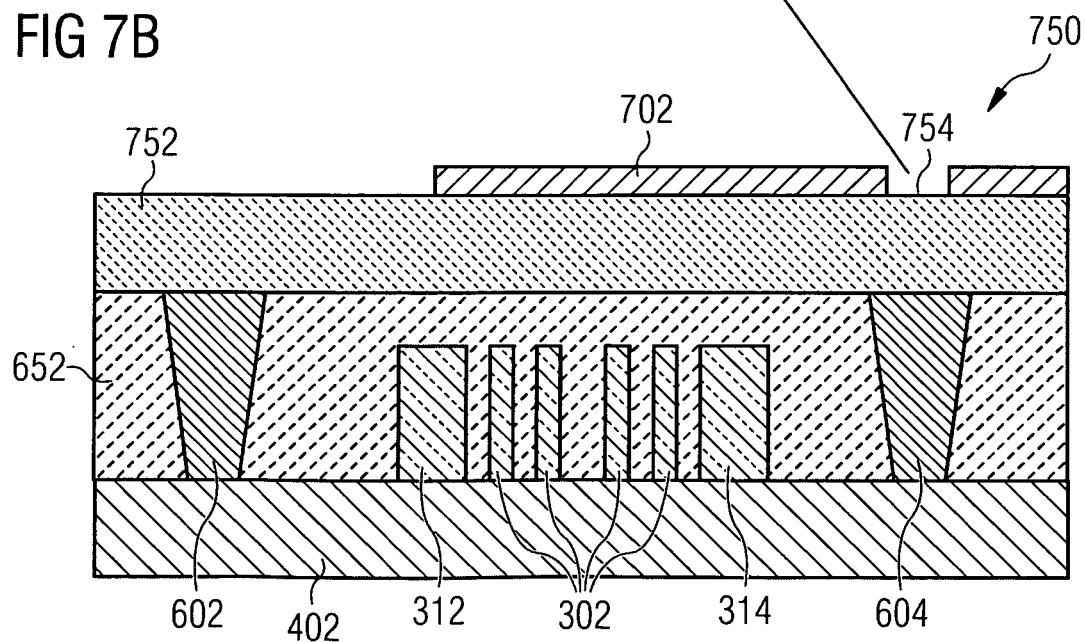

FIGS. 7A and 7B show a top view 700 (FIG. 7A) and a cross sectional view 750 (FIG. 7B) along section line D (along the first direction through an active area 402) of FIG. 7A of a memory cell field in accordance with an embodiment at a fourth stage of its manufacturing.

Next, dielectric material 752 may be deposited over the entire surface of the structure shown in FIG. 6A. In an example, any dielectric material may be used, e.g., an interlayer dielectric (ILD) material such as, e.g., an oxide or a low-k dielectric material such as, e.g., porous glass. After having planarized the deposited dielectric material 752 (e.g., using CMP), an auxiliary mask 702 (e.g., a hard mask) may be deposited as an auxiliary mask plate, for example. The auxiliary mask 702 may be made of an nitride (e.g., silicon nitride) or aluminum oxide ($Al_2O_3$), which may be selected to have a smaller layer thickness as compared to a nitride, due to the fact that ceramics has a very high etching resistance capability), a nitride (e.g., silicon nitride) or of carbon, for example. As shown in FIGS. 7A and 7B, the auxiliary mask 702 may be deposited such that it (at least partially) covers the area in which the drain select gates 312, the source select gates 314 (also referred to as source select lines) and the word lines 302 of the memory cells are formed, as well as the source select gate space. However, the auxiliary mask 702 may be deposited such that it does not cover the drain select gate space 502. Next, using a corresponding lithographic process, a mask (e.g., including a photo resist layer) is illuminated such that further elongate structures 704 may be formed in subsequent processes in the source select gate space 504 (next to the source select gate 312). In an alternative implementation, the elongate structures 704 may be provided by directly printing them (e.g., directly printing of elongate structure chains) or, e.g., by using double patterning technique (also referred to as pitch frag technique). As shown in FIG. 7A, the elongate structures 704 to be formed have an elongate or oblong structure, thereby achieving a more relaxed lithography in this case. As will be described in more detail below, the auxiliary mask 702 may be used as a buried auxiliary mask 702 (e.g., as a buried hard mask 702). The elongate structures 704 may be transferred into the auxiliary mask 702, thereby exposing portions 754 of the upper surface of the dielectric material 752 in the source select gate space, thereby forming long holes in the auxiliary mask 702. In an example, as shown in FIG. 7A, a plurality of (in FIG. 7A, e.g., three) elongate structures 704 may be provided. In an example, the elongate structures 704 intersect the source line contact structures 604 (but are still isolated from them by the dielectric material 752) of a respective source line contact structure chain (in FIG. 7A, in which the source line contact structures 604 are tilted by an angle of 45° with respect to the main axis direction of the active areas 402, each source line contact structure chain may include four source line contact structures 604). In this example, the elongate structures 704 may have a length of about 15 F and a width of about 1.5 F (thus, the contacts to be formed are relaxed with respect to the minimum feature size of the respectively used process node). Furthermore, two adjacent elongate structures 704 may be arranged at a distance from each other of about 6 F (in other words, the width of the auxiliary mask 702 between two adjacent elongate structures 704 may be about 6 F).

Illustratively, this pattern puts the lines down to the contacts in half pitch without electrically contacting further contact structures via the lines.

In an alternative implementation, the formation of the auxiliary mask 702 (e.g., a hard mask) may be deposited such that it covers the entire surface of the structure 600 shown in FIG. 6A. In this implementation, it may be provided that the auxiliary mask 702 may be removed (in other words opened) in the drain select gate space after the formation of the elongate structures 704 in the auxiliary mask 702.

Figure 8A:
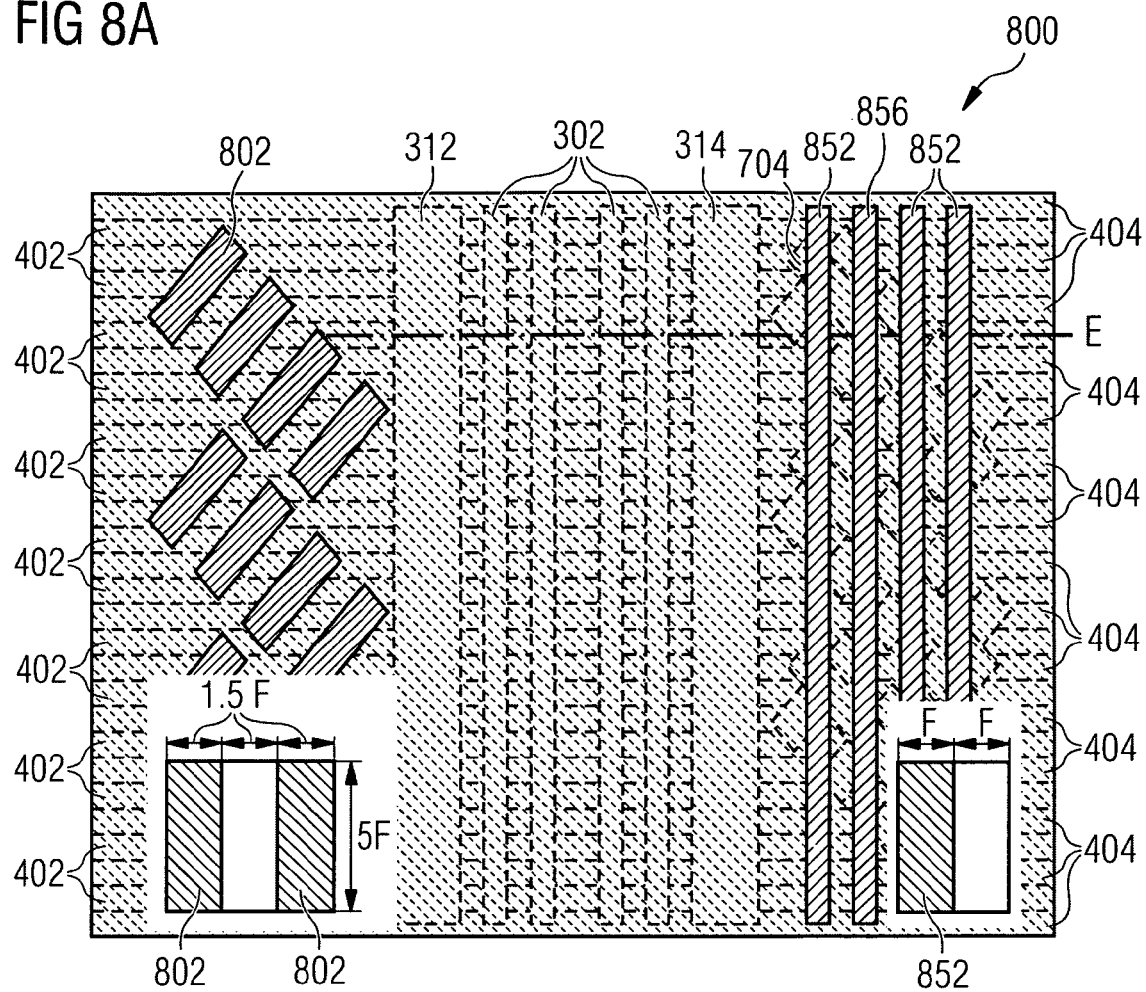
FIGS. 8A and 8B show a top view (FIG. 8A) and a cross sectional view (FIG. 8B) of a memory cell field in accordance with an embodiment at a fifth stage of its manufacturing.
Figure 8B:
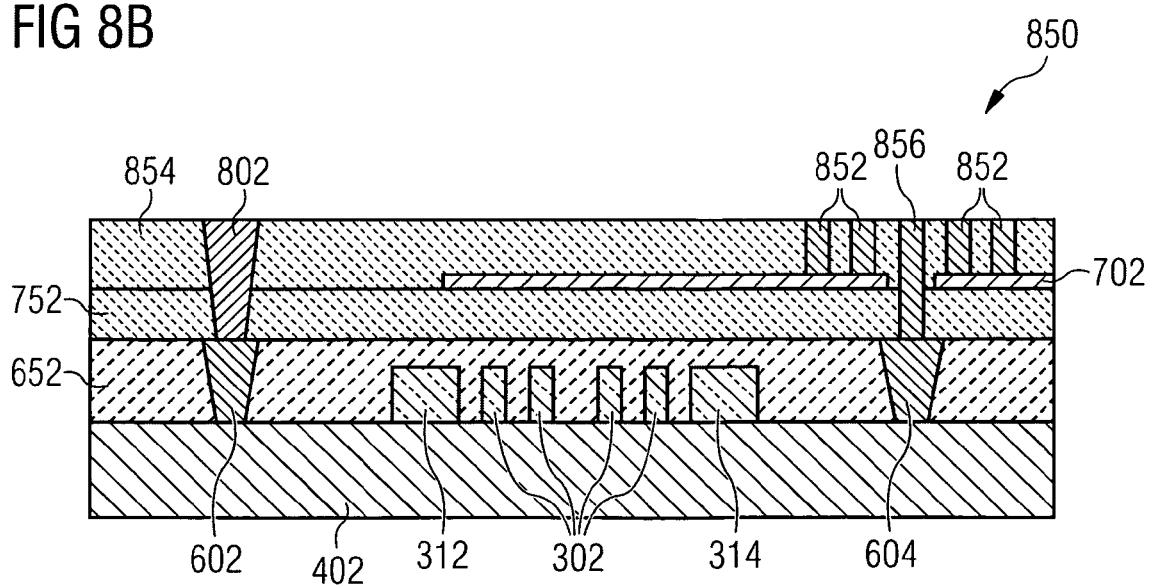

FIGS. 8A and 8B show a top view 800 (FIG. 8A) and a cross sectional view 850 (FIG. 8B) along section line E (along the first direction through an active area 402) of FIG. 8A of a memory cell field in accordance with an embodiment at a fifth stage of its manufacturing.

Next, an additional dielectric layer (e.g., an interlayer dielectric, e.g., made of the same material or different dielectric material as the dielectric material 752) 854 may be deposited (e.g., by means of a CVD or PVD process) over the entire structure 700 as shown in FIG. 7A. The additional dielectric layer 854 may also cover the auxiliary mask 702, which may therefore illustratively be considered as a buried auxiliary mask 702. Next, using, e.g., a photo resist layer and/or an auxiliary mask layer (e.g., a hard mask layer) (not shown in FIG. 8A), the locations of metal contact structures are defined using a suitable lithographic process. The metal contact structures may be first contact structures (Cx) 802 to electrically contact the contact bit line structures 602 via a metal line of a second metal plane (e.g., a metal plane also referred to as M1) or second contact structures 852, 856 provided to electrically connect, e.g., the source line 318 with the source line contact structures 604, wherein the source line 318 may be provided in a first metal plane (e.g., a metal plane also referred to as M0). The lithographic process may include a single exposure process or a double exposure process, for example. In an example, the first contact structures (Cx) 802 may have a width and a pitch of 1.5 F, whereas the second contact structures 852, 856 may have a width and a pitch of F. Then, using the patterned mask(s) and an etching process (e.g. an anisotropic etching process such as, e.g., RIE), the trenches or holes for forming the first contact structures (Cx) 802 and the second contact structures 852, 856, may be formed in the additional dielectric layer 854 and the dielectric material 752. The trenches or holes for forming the first contact structures (Cx) 802 are formed such that the upper surface of the contact bit line structures 602 is at least partially exposed to enable an electrical contact via the first contact structures (Cx) 802 with the bit lines arranged in the second metal plane (e.g., a metal plane also referred to as M1). The trenches or holes for forming the second contact structures 852, 856, may be formed such that either the upper surface of the auxiliary mask 702 is reached (which stops the etching process in this area) (these second contact structures are denoted with reference numeral 852) or the etching may be continued in the region of the opening of the auxiliary mask 702 down to the upper surface of the source line contact structures 604 (these second contact structures are denoted with reference numeral 852), as shown in FIG. 8B. Next, e.g., using a damascene process, the formed trenches or holes may then be filled and possibly overfilled with electrically conductive material such as e.g. tungsten (W) or tungsten (WSi), aluminum (Al), copper (Cu) or any other suitable electrically conductive material. In an implementation, so called contact liners may be provided (e.g., in case tungsten (W) is used for the electrically conductive material, titanium/titanium nitride (Ti/TiN) may be provided as the contact liner material; in case copper (Cu) is used for the electrically conductive material, tantalum nitride (TaN) may be provided as the contact liner material). The overfilling electrically conductive material may then be removed, e.g., using a planarization process such as, e.g., a CMP process.

Figure 9A:
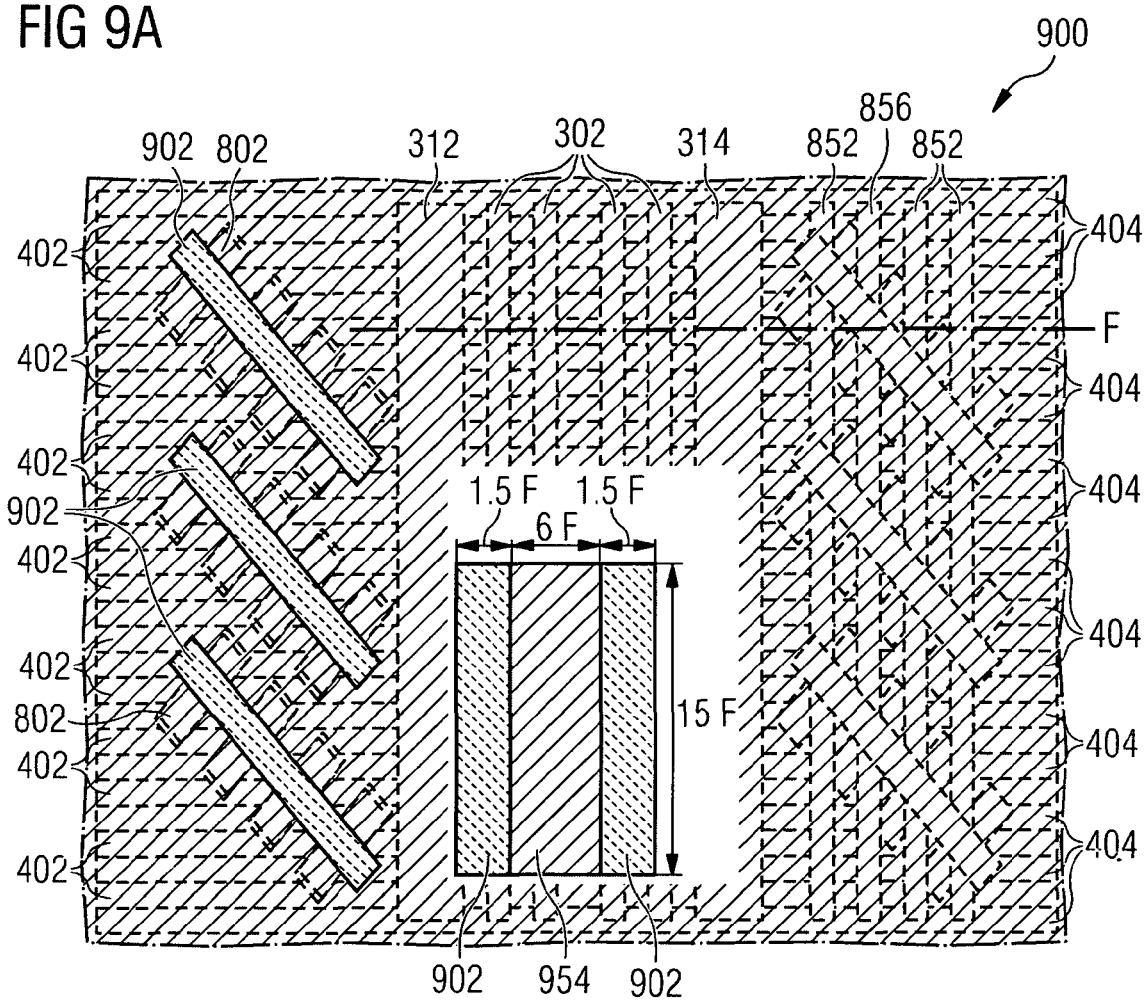
FIGS. 9A and 9B show a top view (FIG. 9A) and a cross sectional view (FIG. 9B) of a memory cell field in accordance with an embodiment at a sixth stage of its manufacturing.
Figure 9B:
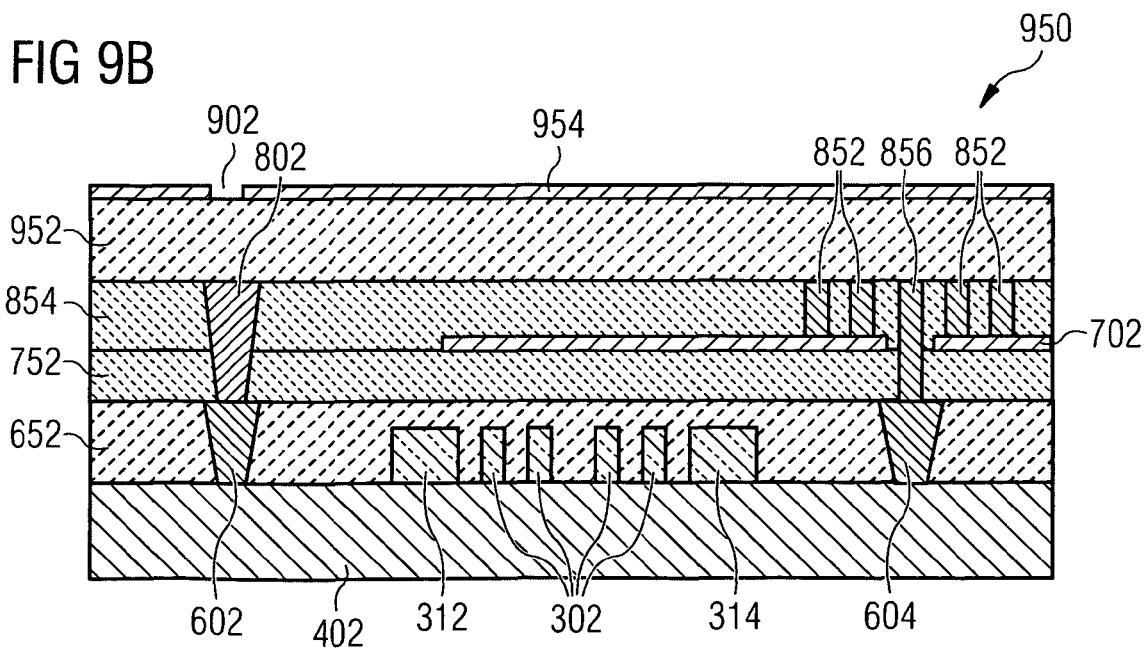

FIGS. 9A and 9B show a top view 900 (FIG. 9A) and a cross sectional view 950 (FIG. 9B) along section line F (along the first direction through an active area 402) of FIG. 9A of a memory cell field in accordance with an embodiment at a sixth stage of its manufacturing.

Then, as shown in FIGS. 9A and 9B, a further dielectric layer (e.g., an interlayer dielectric, e.g., made of the same material or different dielectric material as the dielectric material 752) 952 may be deposited (e.g., by means of a CVD or PVD process) over the entire structure 800 as shown in FIG. 8A. In an implementation, the further dielectric layer covers the entire structure 800 as shown in FIG. 8A. Next, using, e.g., a photo resist layer (not shown in FIG. 9A) and/or an auxiliary mask layer 954 (e.g., a hard mask layer 954), the locations of upper contact structures 902 to electrically contact the first contact structures (Cx) 802 through the further dielectric layer 952 are defined using a suitable lithographic process. The lithographic process may include a single exposure process or a double exposure process, for example. The upper contact structures 902 may have an elongate structure as shown in FIG. 9A. In an example, the upper contact structures 902 may have a width of 1.5 F and a pitch of 6 F, whereas length of the upper contact structures 902 may be 15 F. After having patterned the auxiliary mask layer 954 (e.g., the hard mask layer 954) in accordance with the lithographic process, corresponding portions of the upper surface of the further dielectric layer 952 are exposed. In other words, in an example, the elongate upper contact structures 902 may be transferred into the auxiliary mask 954, thereby exposing portions of the upper surface of the further dielectric material 952 in the drain select gate space, thereby forming long holes in the auxiliary mask 954. In an example, as shown in FIG. 9A, a plurality of (in FIG. 9A, e.g., three) elongate upper contact structures 902 may be provided. In an example, the elongate upper contact structures 902 intersect (but are still isolated from them by the further dielectric material 952) first contact structures (Cx) 802 and contact bit line structures 602 of a respective contact bit line structure chain (in FIG. 9A, in which the contact bit line structures 602 are tilted by an angle of 45° with respect to the main axis direction of the active areas 402, each contact bit line structure chain may include four contact bit line structures 602).

Illustratively, this pattern puts the lines down to the contacts in half pitch without electrically contacting further contact structures via the lines. In an alternative implementation, the elongate upper contact structures 902 may be provided by directly printing them (e.g., directly printing of elongate structure chains) or, e.g., using double patterning technique (also referred to as pitch frag technique). As shown in FIG. 9A, the elongate upper contact structures 902 to be formed have an elongate or oblong structure, thereby achieving a more relaxed lithography in this case. The auxiliary mask layer 954 may be made of an oxide (e.g., silicon oxide or aluminum oxide ($Al_2O_3$), which may be selected to have a smaller layer thickness as compared to a nitride, due to the fact that ceramics have very high etching resistance capability), a nitride (e.g., silicon nitride) or of carbon, for example.

Figure 10A:
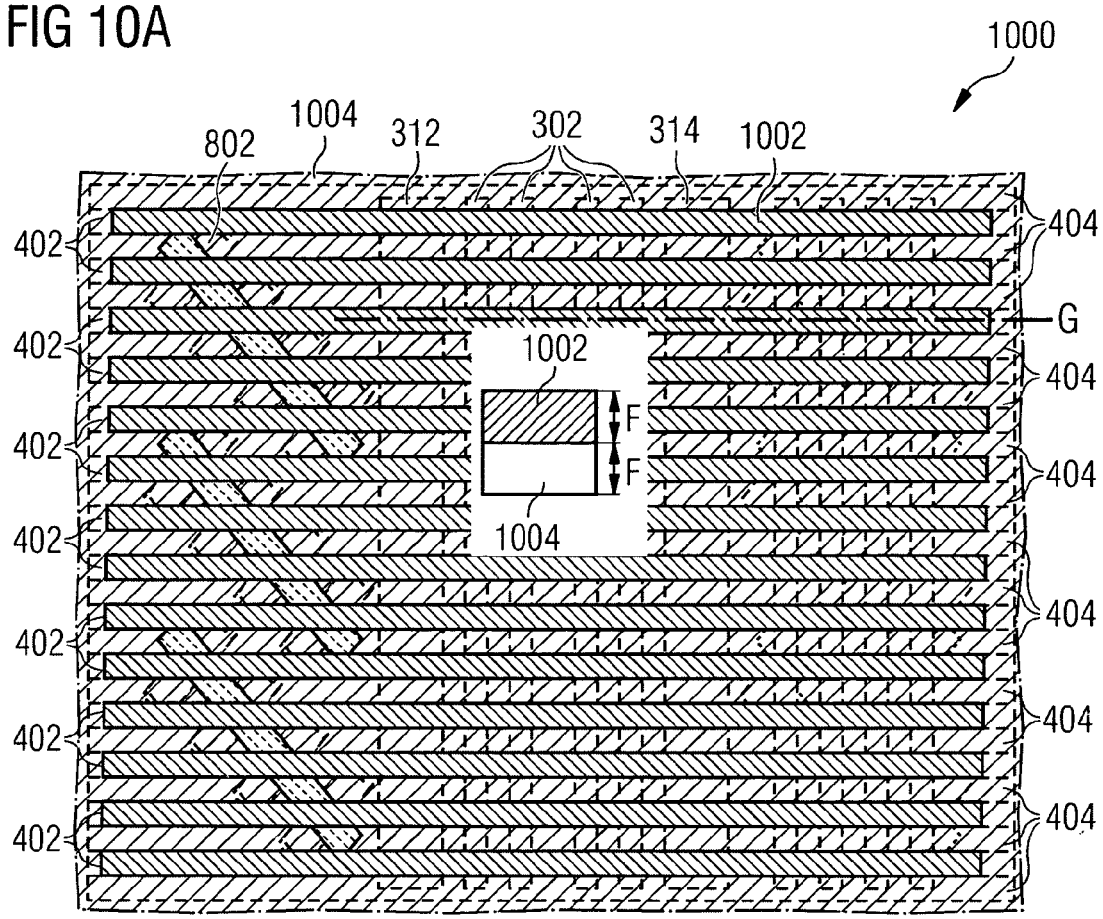
FIGS. 10A and 10B show a top view (FIG. 10A) and a cross sectional view (FIG. 10B) of a memory cell field in accordance with an embodiment at a seventh stage of its manufacturing.
Figure 10B:
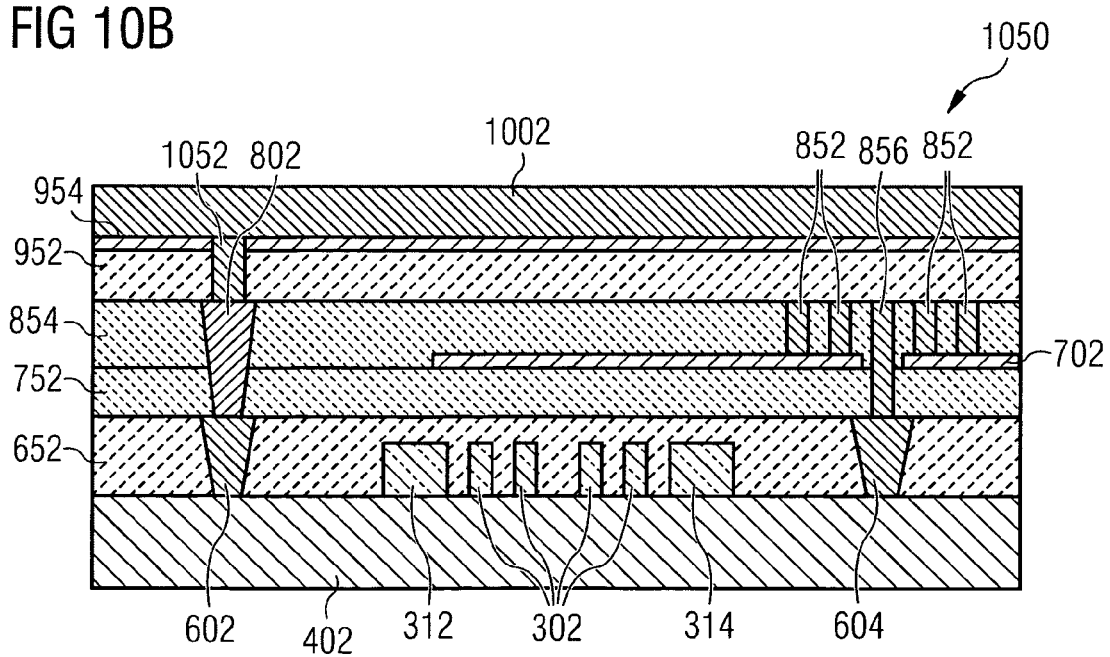

FIGS. 10A and 10B show a top view 1000 (FIG. 10A) and a cross sectional view 1050 (FIG. 10B) along section line G (along the first direction through an active area 402) of FIG. 10A of a memory cell field in accordance with an embodiment at a seventh stage of its manufacturing.

Then, another dielectric layer (not shown in FIGS. 10A and 10B) and a photo resist layer and/or auxiliary mask layer 1004 may be deposited on the entire upper surface of the structure 900 shown in FIG. 9A. Next, using a lithographic process and an etching process (e.g., an anisotropic etching such as, e.g., RIE), structures are prepared for the formation of bit lines 1002 in M1 plane (in other words, an M1 etching is carried out), for example. Then, using the patterned mask(s) 1004 and 954 and an etching process (e.g., an anisotropic etching process such as, e.g., RIE), the trenches or holes for forming the upper contact structures 902 may be formed in the further dielectric layer 952. The trenches or holes for forming the upper contact structures 902 are formed such that the upper surface of the first contact structures (Cx) 802 to enable an electrical contact with the bit lines 1002 arranged in the second metal plane (e.g., a metal plane also referred to as M1). Next, e.g., using a damascene process, the formed trenches or holes and the structures formed in the auxiliary mask layer 1004 may then be filled and possibly overfilled with electrically conductive material 1052 such as, e.g., tungsten (W) or tungsten (WSi), aluminum (Al), copper (Cu) or any other suitable electrically conductive material. In an implementation, so called contact liners may be provided (e.g., in case tungsten (W) is used for the electrically conductive material, titanium/titanium nitride (Ti/TiN) may be provided as the. contact liner material; in case copper (Cu) is used for the electrically conductive material, tantalum nitride (TaN) may be provided as the contact liner material). The overfilling electrically conductive material may then be removed, e.g., using a planarization process such as e.g. a CMP process, thereby forming the bit lines 1002.

It should be mentioned that for reasons of clarity, some of the described layers are shown semi-transparent or transparent, e.g., in the above described top views and in the following side view.

FIGS. 11A to 11C show a top view 1100 (FIG. 11A), a first cross sectional view 1150 (FIG. 11B) along a first section line H (along the length direction through first contact structures (Cx) 802) of FIG. 11A, and a second cross sectional view 1160 (FIG. 11C) along a second section line I (along the length direction through source line contact structures 604) of FIG. 11A of a memory cell field in accordance with an embodiment at the seventh stage of its manufacturing.

As shown in FIG. 11B, the other dielectric layer 1152 is provided, in which the holes filled with the electrically conductive material 1052 are formed, thereby illustratively having the auxiliary mask layer 954 function as a buried auxiliary mask layer (e.g., as buried hard mask layer).

FIGS. 12A to 12C show a three-dimensional perspective view 1200 (FIG. 12A), a third cross sectional view 1250 (FIG. 12B) along a third section line J (perpendicular to the first direction) of FIG. 12A, and a fourth cross sectional view 1260 (FIG. 12C) along a fourth section line K (along the first direction through an active area 402) of FIG. 11A of a memory cell field in accordance with an embodiment at the seventh stage of its manufacturing.

As can be seen in the figures, the contact structures are tilted with respect to the main axis direction of the active areas 402 of the integrated circuit. The number of contact structures in a respective contact chain and the area required by the contact structures may depend on the angle that is formed between the main axis direction of the contact structures and the main axis direction of the active areas.

Figure 13:
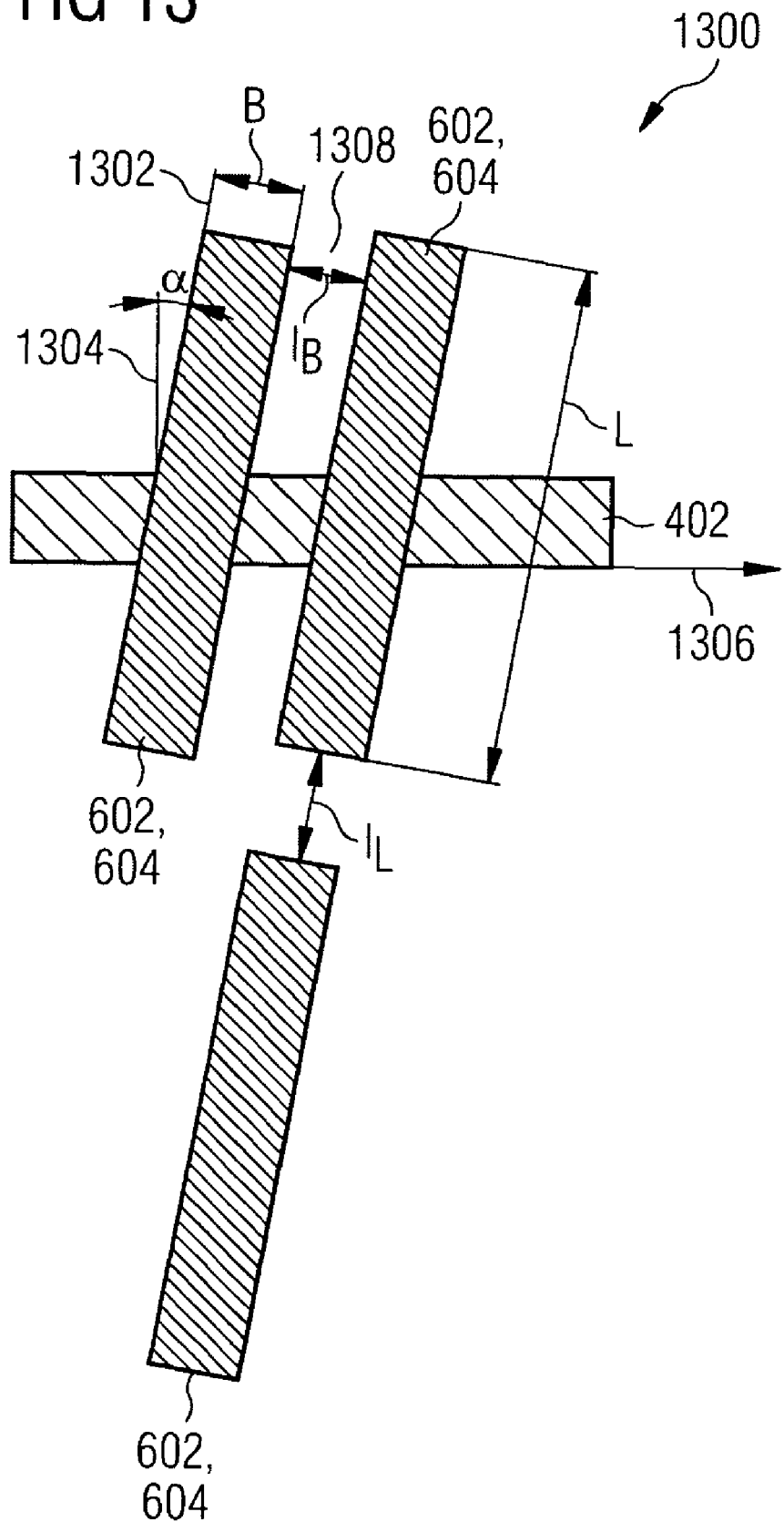
FIG. 13 shows a top view of contact structures illustrating various parameters having an impact on the arrangement of the contact structures with respect to active areas of an integrated circuit in accordance with an embodiment.

Referring now to FIG. 13, this dependency will be described in more detail below. FIG. 13 shows a top view 1300 of contact structures 602, 604, illustrating various parameters having an impact of the arrangement of the contact structures 602, 604, with respect to active areas 402 of an integrated circuit in accordance with an embodiment. As shown in FIG. 13, it is assumed that the main axis direction 1302 of the contact structures 602, 604, forms an angle α with a direction 1304 which is perpendicular to the main axis direction 1306 of the active area 402 (in other words, the angle formed between the main axis direction 1302 of the contact structures 602, 604, and the main axis direction 1306 of the active area 402 is (90°−α)). The contact structures 602, 604, of a respective contact structure chain 1308 are arranged at a distance from each other (in a direction perpendicular to the main axis direction 1302 of the contact structures 602, 604) of $I_B$. The length of the contact structures 602, 604, may be assumed to be L. The width of the contact structures 602, 604, may be assumed to be B. Furthermore, contact structures 602, 604, of adjacent contact structure chains 1308 are arranged at a distance from each other (in the main axis direction 1302 of the contact structures 602, 604) of $I_L$.

In an example, the following preconditions may be assumed: $I_B$=1.5 F; $I_L$=1.5 F; L=3 F; and B=1.5 F.

With this example, as shown in FIGS. 14A to 14C, each contact chain may include three contact structures 602, 604. As shown in a top view 1400 in FIG. 14A, assuming an angle α of about 20°, a space of 7.5 F may be required in the main axis direction of the active areas 402 in the drain select gate space or the source select gate space (the required space is symbolized in FIG. 14A with a first double arrow 1402). Furthermore, as shown in a top view 1420 in FIG. 14B, assuming an angle α of about 45°, also a space of 7.5 F may be required in the main axis direction of the active areas 402 in the drain select gate space 502 or the source select gate space 504 (the required space is symbolized in FIG. 14B with a second double arrow 1422). Furthermore, as shown in a top view 1440 in FIG. 14C, assuming an angle α of about 70°, a space of 10 F may be required in the main axis direction of the active areas 402 in the drain select gate space 502 or the source select gate space 504 (the required space is symbolized in FIG. 14C with a third double arrow 1442). Illustratively, in an example, the larger the angle α (in particular when the angle α is greater than 45°) with a fixed size of the contact structures 602, 604, the more space may be required for the contact structures 602, 604.

In another example, the following preconditions may be assumed: $I_B$=1.5 F; $I_L$=1.5 F; L=5 F; and B=1.5 F.

Figure 15A:
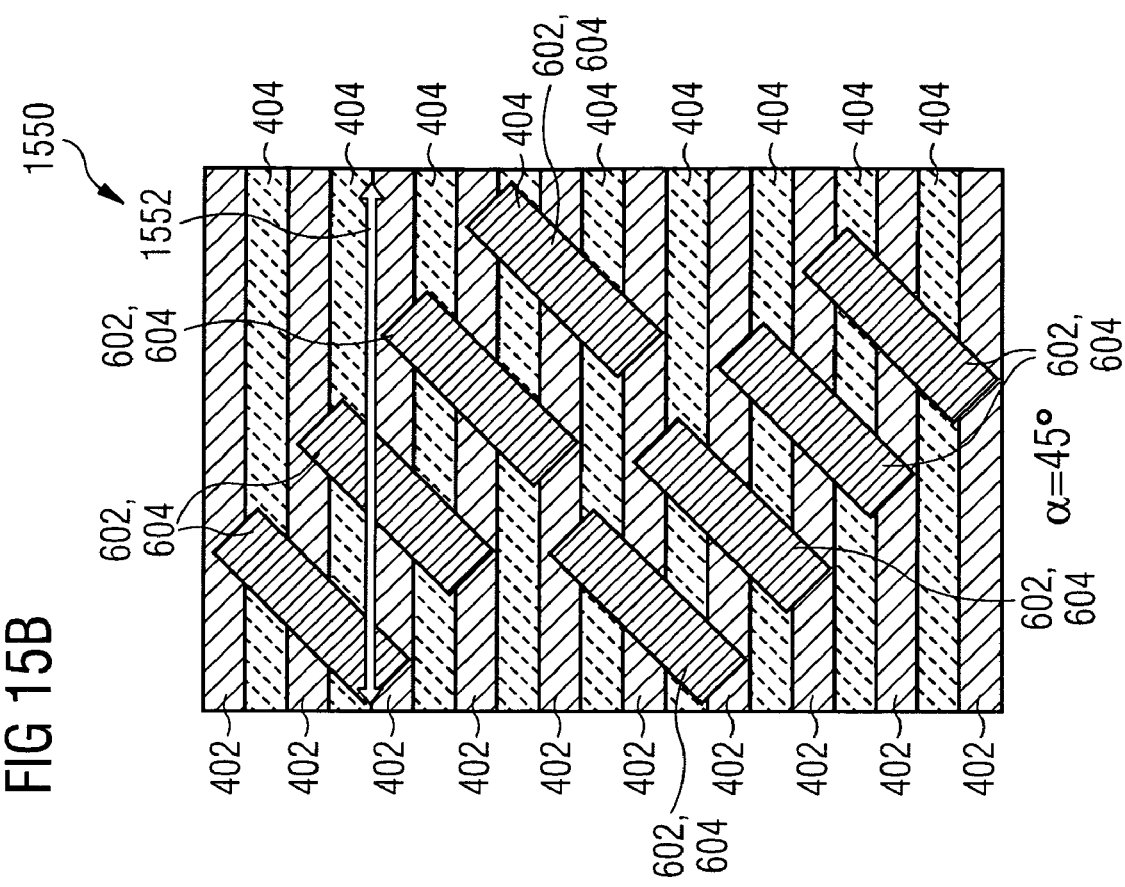
FIGS. 15A and 15B show top views of a memory cell field with different tilting angles of contact structures with respect to active areas in accordance with another example.
Figure 15B:
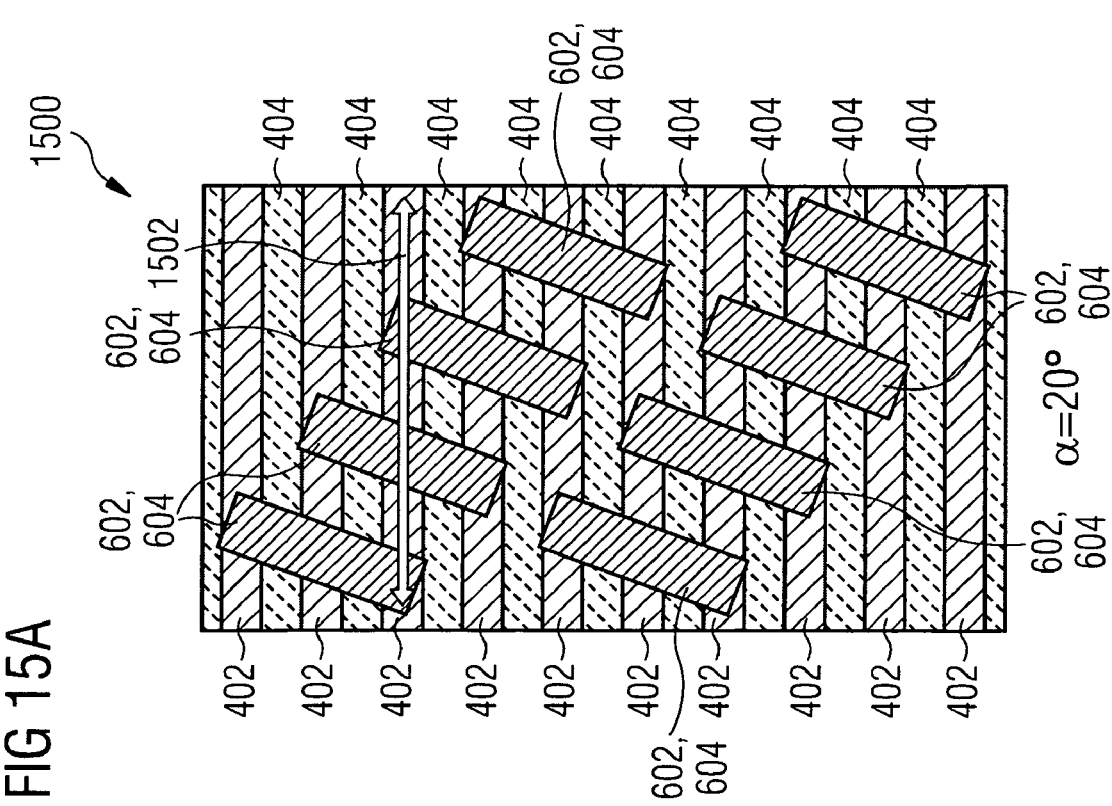

With this example, as shown in FIGS. 15A and 15B, each contact chain may include four contact structures 602, 604 (thus, illustratively, with an increasing length of the contact structures 602, 604, the number of contact structures 602, 604, in one contact chain may increase). As shown in a top view 1500 in FIG. 15A, assuming an angle α of about 20°, a space of 10.5 F may be required in the main axis direction of the active areas 402 in the drain select gate space 502 or the source select gate space 504 (the required space is symbolized in FIG. 15A with a fourth double arrow 1502). Furthermore, as shown in a top view 1550 in FIG. 15B, assuming an angle α of about 45°, also space of 12.5 F may be required in the main axis direction of the active areas 402 in the drain select gate space 502 or the source select gate space 504 (the required space is symbolized in FIG. 15B with a second double arrow 1552).

As described above, in various embodiments, the contact structures may be arranged with their main axis direction tilted by a non-zero angle with respect to the main axis direction of the active area (or alternatively, e.g., of the STIs). In an example, the contact structures may be arranged with their main axis direction tilted by an angle of 45° with respect to the main axis direction of the active area (or alternatively, e.g. of the STIs).

Furthermore, in various embodiments, a plurality of contact structures may be arranged in a row, thereby forming respective contact structure chains including a plurality of contact structures. In this respect, it is to be noted that the tilting of the contact structures with respect to the active areas may result in a reduction of the substrate area required for the contact structures.

Further, in various embodiments, the contact structures may be formed using a damascene process. In various examples, the damascene type contacts may be provided as buried contacts from a metal plane (Mx) to the first contact structures (Cx).

The approach in accordance with various examples, in which the contact structures are arranged from the beginning of their manufacturing in the integrated circuit have e.g. a size of 1.5 F (with F being half-pitch of the respectively used process technology node) in the smallest dimensions may have the following effects, for example:

The contact structures may be directly printed.
The manufacturing of the contact structures may be pitch frag compatible.
The filling concept and the etching may be determined by the previous technology.
An isolation between the contact structures may be relaxed.
There is no limit value for an Mx-Cx isolation, only a limit value for Mx-Mx isolation.
The described examples represent a contact structure arrangement which may be shrunk over a plurality of product generations.

As shown in FIGS. 16A and 16B, in some embodiments, transistor arrangements such as those described herein may be used in modules.

In FIG. 16A, an integrated circuit module 1600 is shown, on which one or more memory devices 1604 are arranged on a substrate 1602. The memory device 1604 may include numerous memory cells. The integrated circuit module 1600 may also include one or more electronic devices 1606, which may include a transistor arrangement, e.g., as described in the embodiments above. The one or more electronic devices 1606 may further include memory, processing circuitry, control circuitry, addressing circuitry, bus interconnection circuitry, or other circuitry or electronic devices that may be combined on a module with a memory device, such as the memory device 1604. Additionally, the integrated circuit module 1600 includes multiple electrical connections 1608, which may be used to connect the integrated circuit module 1600 to other electronic components, including other modules.

As shown in FIG. 16B, in some embodiments, these modules may be stackable, to form a stack 1650. For example, a stackable integrated circuit module 1652 may contain one or more memory devices 1656, arranged on a stackable substrate 1654. The stackable integrated circuit module 1652 may also include one or more electronic devices 1658, which may include one or more transistor arrangement described in the various embodiments above. The electronic devices 1658 may further include memory, processing circuitry, control circuitry, addressing circuitry, bus interconnection circuitry, or other circuitry or electronic devices that may be combined on a module with a memory device, such as the memory device 1656. Electrical connections 1660 are used to connect the stackable integrated circuit module 1652 with other modules in the stack 1650, or with other electronic devices. Other modules in the stack 1650 may include additional stackable memory modules, similar to the stackable integrated circuit module 1652 described above, or other types of stackable modules, such as stackable processing modules, control modules, communication modules, or other modules containing electronic components.

In an embodiment, an integrated circuit is provided. The integrated circuit may include an active area extending along a first direction corresponding to a current flow direction through the active area, and a contact structure having an elongate structure. The contact structure may be electrically coupled with the active area, and the contact structure may be arranged such that the length direction of the contact structure forms a non-zero angle with the first direction of the active area.

In an example of this embodiment, the integrated circuit may further include at least one transistor containing the active area.

In another example of this embodiment, the at least one transistor may be at least one field effect transistor or at least one bipolar transistor.

In yet another example of this embodiment, the at least one transistor may include a plurality of transistors including the active area.

In yet another example of this embodiment, the integrated circuit may further include at least one memory cell comprising the active area.

In yet another example of this embodiment, the at least one memory cell may include a plurality of memory cells having the active area.

In yet another example of this embodiment, the at least one memory cell may be arranged in accordance with a NAND structure.

In yet another example of this embodiment, the at least one memory cell is a non-volatile memory cell.

In yet another example of this embodiment, the at least one memory cell is a charge storing memory cell (e.g., a floating gate memory cell or a charge trapping memory cell).

In yet another example of this embodiment, the active area may be arranged in a fin structure.

In yet another example of this embodiment, the contact structure may have a cuboid shape or an elliptic shape.

In yet another example of this embodiment, the contact structure may be electrically coupled with a control terminal (e.g., the gate terminal of a field effect transistor or the base terminal of a bipolar transistor) of the at least one transistor.

In yet another example of this embodiment, the contact structure may be electrically coupled with a controlled terminal (e.g., a source/drain terminal of a field effect transistor or the emitter terminal or the collector terminal of a bipolar transistor) of the at least one transistor.

In yet another example of this embodiment, the integrated circuit may further include a further active area arranged adjacent to the active area and extending along a second direction corresponding to a current flow direction through the further active area.

In yet another example of this embodiment, the active area and the further active area may run substantially parallel with one another.

In yet another example of this embodiment, the integrated circuit may further include a further contact structure having an elongate structure. The further contact structure may be electrically coupled with the further active area, and the further contact structure may be arranged such that the length direction of the further contact structure forms a non-zero angle with the second direction of the active area.

In yet another example of this embodiment, the contact structure may be a damascene manufactured contact structure.

In yet another example of this embodiment, the contact structure is a printed contact structure.

In another embodiment, an integrated circuit is provided. The integrated circuit may include a transistor active area, and a contact having an oblong structure. The contact structure may be electrically coupled with the transistor active area, and the contact may be arranged such that its length direction forms an angle with the current flow direction through the transistor active area.

In an example of this embodiment, the integrated circuit may further include at least one transistor containing the active area.

In another example of this embodiment, the at least one transistor may be at least one field effect transistor or at least one bipolar transistor.

In yet another example of this embodiment, the transistor may include a plurality of transistors containing the transistor active area.

In yet another example of this embodiment, the transistor may include a memory cell having the transistor active area.

In yet another example of this embodiment, the memory cell may include a plurality of memory cells including the transistor active area.

In yet another example of this embodiment, the memory cell may be arranged in accordance with a NAND structure.

In yet another example of this embodiment, the memory cell may be a non-volatile memory cell.

In yet another example of this embodiment, the memory cell is a charge storing memory cell (e.g., a floating gate memory cell or a charge trapping memory cell).

In yet another example of this embodiment, the transistor active area may be arranged in a fin structure.

In yet another example of this embodiment, the contact may have a cuboid shape or an elliptic shape.

In yet another example of this embodiment, the contact may be electrically coupled with a control terminal (e.g., the gate terminal of a field effect transistor or the base terminal of a bipolar transistor) of the transistor.

In yet another example of this embodiment, the contact may be electrically coupled with a controlled terminal (e.g., a source/drain terminal of a field effect transistor or the emitter terminal or the collector terminal of a bipolar transistor) of the transistor.

In yet another example of this embodiment, the integrated circuit may further include a further transistor active area arranged adjacent to the transistor active area.

In yet another example of this embodiment, the transistor active area and the further transistor active area may run substantially parallel with one another.

In yet another example of this embodiment, the integrated circuit may further include a further contact having an oblong structure, wherein the further contact is electrically coupled with the further transistor active area, and wherein the further contact is arranged such that its length direction forms an angle with the current flow direction through the further transistor active area.

In yet another example of this embodiment, the contact may be a damascene manufactured contact.

In yet another example of this embodiment, the contact may be a printed contact.

In an embodiment, a method for manufacturing an integrated circuit is provided. The method may include forming an active area extending along a first direction corresponding to a current flow direction through the active area, and forming a contact structure having an elongate structure such that the contact structure is electrically coupled with the active area, and such that the contact structure is arranged such that the length direction of the contact structure forms a non-zero angle with the first direction of the active area.

In an example of this embodiment, the method may further include forming at least one transistor including the active area.

In another example of this embodiment, the at least one transistor may be formed as at least one field effect transistor or as at least one bipolar transistor.

In yet another example of this embodiment, forming the at least one transistor may include forming a plurality of transistors including the active area.

In yet another example of this embodiment, the method may further include forming at least one memory cell comprising the active area.

In yet another example of this embodiment, forming the at least one memory cell may include forming a plurality of memory cells including the active area.

In yet another example of this embodiment, the at least one memory cell may be arranged in accordance with a NAND structure.

In yet another example of this embodiment, the at least one memory cell may be formed as a non-volatile memory cell.

In yet another example of this embodiment, the at least one memory cell may be formed as a charge storing memory cell (e.g., as a floating gate memory cell or as a charge trapping memory cell).

In yet another example of this embodiment, the active area may be formed in a fin structure.

In yet another example of this embodiment, the contact structure may be formed to have a cuboid shape or an elliptic shape.

In yet another example of this embodiment, the contact structure may be electrically coupled with a control terminal (e.g., the gate terminal of a field effect transistor or the base terminal of a bipolar transistor) of the at least one transistor.

In yet another example of this embodiment, the contact structure may be electrically coupled with a controlled terminal (e.g., a source/drain terminal of a field effect transistor or the emitter terminal or the collector terminal of a bipolar transistor) of the at least one transistor.

In yet another example of this embodiment, the method may further include forming a further active area adjacent to the active area and extending along a second direction corresponding to a current flow direction through the further active area.

In yet another example of this embodiment, the active area and the further active area may run substantially parallel with one another.

In yet another example of this embodiment, the method may further include forming a further contact structure having an elongate structure, wherein the further contact structure is electrically coupled with the further active area, and wherein the further contact structure is arranged such that the length direction of the further contact structure forms a non-zero angle with the second direction of the active area.

In yet another example of this embodiment, the contact structure may be formed using a damascene process.

In yet another example of this embodiment, the contact structure may be printed.

In another embodiment, a method for manufacturing an integrated circuit is provided. The method may include forming a transistor active area, and forming a contact having an oblong structure such that the contact is electrically coupled with the transistor active area, and that the contact is arranged such that its length direction forms an angle with the current flow direction through the transistor active area.

In an example of this embodiment, the method may further include forming a transistor including the transistor active area, wherein the transistor is formed as at least one field effect transistor or as at least one bipolar transistor.

In another example of this embodiment, the transistor may include a plurality of transistors including the transistor active area.

In yet another example of this embodiment, the transistor may be formed as a memory cell including the transistor active area.

In yet another example of this embodiment, the memory cell may include a plurality of memory cells including the transistor active area.

In yet another example of this embodiment, the memory cell may be formed such that it is arranged in accordance with a NAND structure.

In yet another example of this embodiment, the memory cell may be formed as a non-volatile memory cell.

In yet another example of this embodiment, the memory cell may be formed as a charge storing memory cell (e.g., as a floating gate memory cell or as a charge trapping memory cell).

In yet another example of this embodiment, the transistor active area may be formed in a fin structure.

In yet another example of this embodiment, the contact may be formed such that it has a cuboid shape or an elliptic shape.

In yet another example of this embodiment, the contact may be electrically coupled with a control terminal (e.g., the gate terminal of a field effect transistor or the base terminal of a bipolar transistor) of the transistor.

In yet another example of this embodiment, the contact is electrically coupled with a controlled terminal (e.g., a source/drain terminal of a field effect transistor or the emitter terminal or the collector terminal of a bipolar transistor) of the transistor.

In yet another example of this embodiment, the method may further include forming a further transistor active area arranged adjacent to the transistor active area.

In yet another example of this embodiment, the transistor active area and the further transistor active area may be formed such that they run substantially parallel with one another.

In yet another example of this embodiment, the method may further include forming a further contact having an oblong structure, wherein the further contact is electrically coupled with the further transistor active area, and wherein the further contact is arranged such that its length direction forms an angle with the current flow direction through the further transistor active area.

In yet another example of this embodiment, the contact structure may be formed using a damascene process.

In yet another example of this embodiment, the contact structure may be printed. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit having one or more layers formed vertically above a substrate, comprising:
   an active area formed on the substrate, the active area extending along a first horizontal direction corresponding to a current flow direction through the active area;
   a contact structure having a horizontal elongate structure;
   wherein the contact structure is electrically coupled with the active area; and
   wherein the contact structure is arranged such that a horizontal length direction of the contact structure forms a non-zero angle less than 90 degrees with the first horizontal direction of the active area.

2. The integrated circuit of claim 1, further comprising at least one transistor disposed in the active area.

3. The integrated circuit of claim 2, wherein the least one transistor comprises a plurality of transistors disposed in the active area.

4. The integrated circuit of claim 2, wherein the contact structure is electrically coupled with a controlled terminal of the at least one transistor.

5. The integrated circuit of claim 1, further comprising at least one memory cell disposed in the active area.

6. The integrated circuit of claim 5, wherein the at least one memory cell comprises a non-volatile memory cell.

7. The integrated circuit of claim 5, wherein the at least one memory cell comprises a charge storing memory cell.

8. The integrated circuit of claim 1, wherein the active area is arranged in a fin structure.

9. The integrated circuit of claim 1, further comprising a further active area arranged adjacent the active area and extending along a second horizontal direction corresponding to a current flow direction through the further active area.

10. The integrated circuit of claim 9, further comprising:
    a further contact structure having a horizontal elongate structure;
    wherein the further contact structure is electrically coupled with the further active area; and
    wherein the further contact structure is arranged such that a horizontal length direction of the further contact structure forms a non-zero angle less than 90 degrees with the second horizontal direction of the further active area.

11. An integrated circuit having one or more layers formed vertically above a substrate, comprising:
    a transistor active area formed on the substrate;
    a contact having an oblong structure in a horizontal plane;
    wherein the contact is electrically coupled with the transistor active area; and
    wherein the contact is arranged such that a length direction of the contact in the horizontal plane forms a non-zero angle less than 90 degrees with a current flow direction in the horizontal plane through the transistor active area.

12. The integrated circuit of claim 11, further comprising a transistor disposed in the transistor active area.

13. The integrated circuit of claim 12, wherein the transistor comprises a memory cell.

14. The integrated circuit of claim 13, wherein the memory cell comprises a non-volatile memory cell.

15. The integrated circuit of claim 13, wherein the memory cell comprises a charge storing memory cell.

16. The integrated circuit of claim 11, wherein the contact is electrically coupled with a control terminal of the transistor.

17. A method for manufacturing an integrated circuit having one or more layers formed vertically above a substrate, the method comprising:
    forming an active area on the substrate extending along a first horizontal direction corresponding to a current flow direction through the active area; and
    forming a contact structure having a horizontal elongate structure such that the contact structure is electrically coupled with the active area, and such that the contact structure is arranged such that a horizontal length direction of the contact structure forms a non-zero angle less than 90 degrees with the first horizontal direction of the active area.

18. The method of claim 17, wherein forming the contact structure comprises using a damascene process.

19. The method of claim 17, wherein forming the contact structure comprises performing a printing process.

20. A method for manufacturing an integrated circuit having one or more layers formed vertically above a substrate, the method comprising:
    forming a transistor active area on the substrate; and
    forming a contact having an oblong structure in a horizontal plane such that the contact is electrically coupled with the transistor active area, and that the contact is arranged such that a length direction of the contact in the horizontal plane forms a non-zero angle less than 90 degrees with a current flow direction in the horizontal plane through the transistor active area.

21. The method of claim 20, wherein forming the contact comprises using a damascene process.

22. The method of claim 20, wherein forming the contact comprises performing a printing process.

23. A memory module, comprising
    a plurality of integrated circuits, wherein at least one integrated circuit of the plurality of integrated circuits has one or more layers formed vertically above a substrate and comprises:
    an active area formed on the substrate and extending along a first horizontal direction corresponding to a current flow direction through the active area; and
    a contact structure having a horizontal elongate structure, wherein the contact structure is electrically coupled with the active area, and wherein the contact structure is arranged such that a horizontal length direction of the contact structure forms a non-zero angle less than 90 degrees with the first horizontal direction of the active area.

* * * * *